(12) United States Patent
Yu

(10) Patent No.: US 12,137,593 B2
(45) Date of Patent: Nov. 5, 2024

(54) DISPLAY SUBSTRATE, PREPARATION METHOD FOR SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventor: Tiancheng Yu, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 575 days.

(21) Appl. No.: 17/432,953

(22) PCT Filed: Jan. 20, 2021

(86) PCT No.: PCT/CN2021/072798
§ 371 (c)(1),
(2) Date: Aug. 23, 2021

(87) PCT Pub. No.: WO2022/155801
PCT Pub. Date: Jul. 28, 2022

(65) Prior Publication Data
US 2023/0135818 A1 May 4, 2023

(51) Int. Cl.
*H10K 59/35* (2023.01)
*H10K 59/80* (2023.01)
(Continued)

(52) U.S. Cl.
CPC ......... *H10K 59/353* (2023.02); *H10K 59/873* (2023.02); *H10K 59/876* (2023.02);
(Continued)

(58) Field of Classification Search
CPC ....... H10K 50/00–88; H10K 59/00–95; H10K 71/00–861; G08G 1/095
See application file for complete search history.

(56) References Cited

U.S. PATENT DOCUMENTS 5,596,402 A * 1/1997 Markantes ............. G07D 7/128
359/477
2006/0066228 A1 3/2006 Antoniadis et al.
(Continued)

FOREIGN PATENT DOCUMENTS

| CN | 1760969 A | * | 4/2006 | ............. F16M 11/12 |
| CN | 102937763 A | | 2/2013 | |

(Continued)

OTHER PUBLICATIONS

Machine translation, Zhou, Chinese Pat. Pub. No. CN109659443A, translation date: Feb. 28, 2024, Espacenet, all pages. (Year: 2024).*
(Continued)

*Primary Examiner* — Victoria K. Hall
(74) *Attorney, Agent, or Firm* — Ling Wu; Stephen Yang; Ling and Yang Intellectual Property

(57) ABSTRACT

A display substrate includes multiple light-emitting units. At least one light-emitting unit includes a first light-emitting device that emits first-color light and a second light-emitting device that emits second-color light. The display substrate displays a first color in a first view angle range smaller than a first view angle, and displays a second color in a second view angle range larger than a second view angle. Or, the display substrate displays the second color in the first view angle range smaller than the first view angle, and displays the first color in the second view angle range larger than the second view angle. The view angle is an included angle between a line of sight of a viewer and a normal of a viewing (Continued)

region in the display substrate, and the second view angle is larger than the first view angle.

16 Claims, 11 Drawing Sheets

(51) Int. Cl.
   *H10K 71/00* (2023.01)
   *H10K 102/00* (2023.01)
(52) U.S. Cl.
   CPC ....... *H10K 71/00* (2023.02); *H10K 2102/311* (2023.02); *H10K 2102/351* (2023.02)

(56) References Cited

U.S. PATENT DOCUMENTS

| | | | | |
|---|---|---|---|---|
| 2008/0143649 | A1* | 6/2008 | Asaki | H10K 50/813 |
| | | | | 345/76 |
| 2013/0257926 | A1* | 10/2013 | Lee | G02B 30/23 |
| | | | | 345/88 |
| 2014/0009505 | A1* | 1/2014 | Moon | G09G 3/006 |
| | | | | 345/690 |
| 2014/0126765 | A1* | 5/2014 | Tierney | B41M 3/144 |
| | | | | 101/483 |
| 2019/0198576 | A1* | 6/2019 | Schubert | G02B 26/06 |
| 2019/0296264 | A1 | 9/2019 | Mathai et al. | |
| 2020/0130396 | A1* | 4/2020 | Godfrey | B42D 25/355 |
| 2020/0161585 | A1 | 5/2020 | Palles-Dimmock et al. | |
| 2020/0251535 | A1 | 8/2020 | Fan et al. | |
| 2021/0028239 | A1* | 1/2021 | Irobe | H10K 59/38 |
| 2021/0225952 | A1* | 7/2021 | Zhou | H10K 50/82 |
| 2021/0335912 | A1 | 10/2021 | Li | |
| 2021/0339504 | A1* | 11/2021 | Scherer | C09B 67/0098 |
| 2021/0376295 | A1 | 12/2021 | Zhou | |
| 2023/0380241 | A1* | 11/2023 | Song | H10K 59/353 |

FOREIGN PATENT DOCUMENTS

| | | | | |
|---|---|---|---|---|
| CN | 108598124 | A | | 9/2018 |
| CN | 108695359 | A | | 10/2018 |
| CN | 108878504 | A | | 11/2018 |
| CN | 109659443 | A * | 4/2019 | ............ H01L 22/20 |
| CN | 109904196 | A | | 6/2019 |
| CN | 109904348 | A | | 6/2019 |
| CN | 111091785 | A | | 5/2020 |
| CN | 111200069 | A | | 5/2020 |
| CN | 111599281 | A * | 8/2020 | ............ G09F 9/301 |
| WO | 2007079423 | A2 | | 7/2007 |
| WO | 2009032859 | A1 | | 3/2009 |

OTHER PUBLICATIONS

Machine translation, Lai, Chinese Pat. Pub. No. CN1760969A, translation date: Feb. 28, 2024, Espacenet, all pages. (Year: 2024).*
Machine translation, Yang, Chinese Pat. Pub. No. CN111599281A, translation date: Feb. 28, 2024, Espacenet, all pages. (Year: 2024).*
Haihua Tao et al., "Microcavity Effects of Organic Electroluminescence", Optics & Optoelectronic Technology, vol. 2, No. 2, Apr. 2004, pp. 61-64.

* cited by examiner

DISPLAY SUBSTRATE, PREPARATION METHOD FOR SAME, AND DISPLAY DEVICE

CROSS-REFERENCE TO RELATED APPLICATION

The present application is a U.S. National Phase Entry of International Application No. PCT/CN2021/072798 having an international filing date of Jan. 20, 2021, the entire content of which is hereby incorporated by reference.

TECHNICAL FIELD

The present disclosure relates, but is not limited, to the technical field of display, and particularly to a display substrate, a preparation method for the same, and a display device.

BACKGROUND

As a novel flat panel display, Organic Light Emitting Diode (OLED) display device has gradually attracted more attention. As an active light-emitting device, an OLED has the advantages of high brightness, color saturation, ultra-thin design, wide view angle, relatively low power consumption, extremely quick response, flexibility, etc., and may meet an individual requirement of a user. With the constant development of a display technology, a display device that adopts an OLED as a light-emitting device and adopts a Thin Film Transistor (TFT) for signal control has become a mainstream product in the field of display at present.

SUMMARY

The below is a summary about the subject matter described in the present disclosure in detail. The summary is not intended to limit the scope of protection of the claims.

A display substrate includes multiple light-emitting units. At least one light-emitting unit includes a first light-emitting device that emits first-color light and a second light-emitting device that emits second-color light. The display substrate displays a first color in a first view angle range smaller than a first view angle, and displays a second color in a second view angle range larger than a second view angle. Or, the display substrate displays the second color in the first view angle range smaller than the first view angle, and displays the first color in the second view angle range larger than the second view angle. The view angle is an included angle between a line of sight of a viewer and a normal of a viewing region in the display substrate, and the second view angle is larger than the first view angle.

In an exemplary implementation mode, the display substrate displays a third color in a third view angle range larger than the first view angle and smaller than the second view angle.

In an exemplary implementation mode, the first view angle is 15° to 20°, and the second view angle is 50° to 55°.

In an exemplary implementation mode, the first view angle range is 0° to 15°, the second view angle range is 55° to 65°, and the third view angle range is 25° to 40°.

In an exemplary implementation mode, the display substrate includes a driving structure layer arranged on a base substrate, a light-emitting structure layer arranged on the driving structure layer, and an encapsulation structure layer arranged on the light-emitting structure layer. The light-emitting structure layer includes an anode, a cathode, and an organic light-emitting layer arranged between the anode and the cathode. In a micro-cavity formed by the anode and the cathode, a distance between an anode and cathode in the first light-emitting device is a first micro-cavity length, and a distance between an anode and cathode in the second light-emitting device is a second micro-cavity length. A ratio of the first micro-cavity length to the second micro-cavity length is 1.24K to 1.63K. Or, a ratio of the first micro-cavity length to the second micro-cavity length is 0.75K to 1.06K. $K=\lambda_1/\lambda_2$, where $\lambda_1$ is a wavelength of the first-color light emitted by the first light-emitting device, and $\lambda_2$ is a wavelength of the second-color light emitted by the second light-emitting device.

In an exemplary implementation mode, the first color includes red, the second color includes green, and the third color includes yellow. The first micro-cavity length is 340 nm to 370 nm, and the second micro-cavity length is 190 nm to 230 nm.

In an exemplary implementation mode, the first color includes red, the second color includes green, and the third color includes yellow. The first micro-cavity length is 260 nm to 320 nm, and the second micro-cavity length is 250 nm to 290 nm.

In an exemplary implementation mode, the organic light-emitting layer includes an electron block layer, a light-emitting layer, and a hole block layer which are stacked. The electron block layer is arranged between the anode and the light-emitting layer. The hole block layer is arranged between the cathode and the light-emitting layer. A light-emitting layer in the first light-emitting device includes a first-color light-emitting layer. A light-emitting layer in the second light-emitting device includes a second-color light-emitting layer. A thickness of a hole block layer in the first light-emitting device is the same as that of a hole block layer in the second light-emitting device. A thickness of an electron block layer in the first light-emitting device is 76 nm to 152 nm. A thickness of an electron block layer in the second light-emitting layer is 10 nm to 38 nm.

In an exemplary implementation mode, the organic light-emitting layer further includes a hole transport layer and an electron transport layer. The hole transport layer is arranged between the anode and the electron block layer. The electron transport layer is arranged between the cathode and the hole block layer. A thickness of a hole transport layer in the first light-emitting device is the same as that of a hole transport layer in the second light-emitting device. A thickness of an electron transport layer in the first light-emitting device is the same as that of an electron transport layer in the second light-emitting device.

In an exemplary implementation mode, the organic light-emitting layer further includes a hole injection layer and an electron injection layer. The hole injection layer is arranged between the anode and the hole transport layer. The electron injection layer is arranged between the cathode and the electron transport layer. A thickness of a hole injection layer in the first light-emitting device is the same as that of a hole injection layer in the second light-emitting device. A thickness of an electron injection layer in the first light-emitting device is the same as that of an electron injection layer in the second light-emitting device.

A preparation method for a display substrate is provided. The display substrate includes multiple light-emitting units. At least one light-emitting unit includes a first light-emitting device that emits first-color light and a second light-emitting device that emits second-color light. The preparation method includes the following operation.

A driving structure layer, a light-emitting structure layer arranged on the driving structure layer, and an encapsulation structure layer arranged on the light-emitting structure layer are sequentially formed on a base substrate. The light-emitting structure layer includes an anode, a cathode, and an organic light-emitting layer arranged between the anode and the cathode. In a micro-cavity formed by the anode and the cathode, a distance between an anode and cathode in the first light-emitting device is a first micro-cavity length, and a distance between an anode and cathode in the second light-emitting device is a second micro-cavity length. A ratio of the first micro-cavity length to the second micro-cavity length is 1.24K to 1.63K. Or, a ratio of the first micro-cavity length to the second micro-cavity length is 0.75K to 1.06K. $K=\lambda_1/\lambda_2$, where $\lambda_1$ is a wavelength of the first-color light emitted by the first light-emitting device, and $\lambda_2$ is a wavelength of the second-color light emitted by the second light-emitting device.

A display device includes the abovementioned display substrate.

In an exemplary implementation mode, the display device further includes a driving device, connected with and deflecting the display substrate.

In an exemplary implementation mode, the driving device includes a rotating mechanism capable of rotating the display substrate.

In an exemplary implementation mode, the driving device includes a folding mechanism capable of folding the display substrate.

After the drawings and the detailed descriptions are read and understood, the other aspects may be comprehended.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure and not intended to form limits to the technical solutions of the present disclosure. The shapes and sizes of each component in the drawings do not reflect the true scale, and are only intended to schematically describe the contents of the present disclosure.

Figure 1:
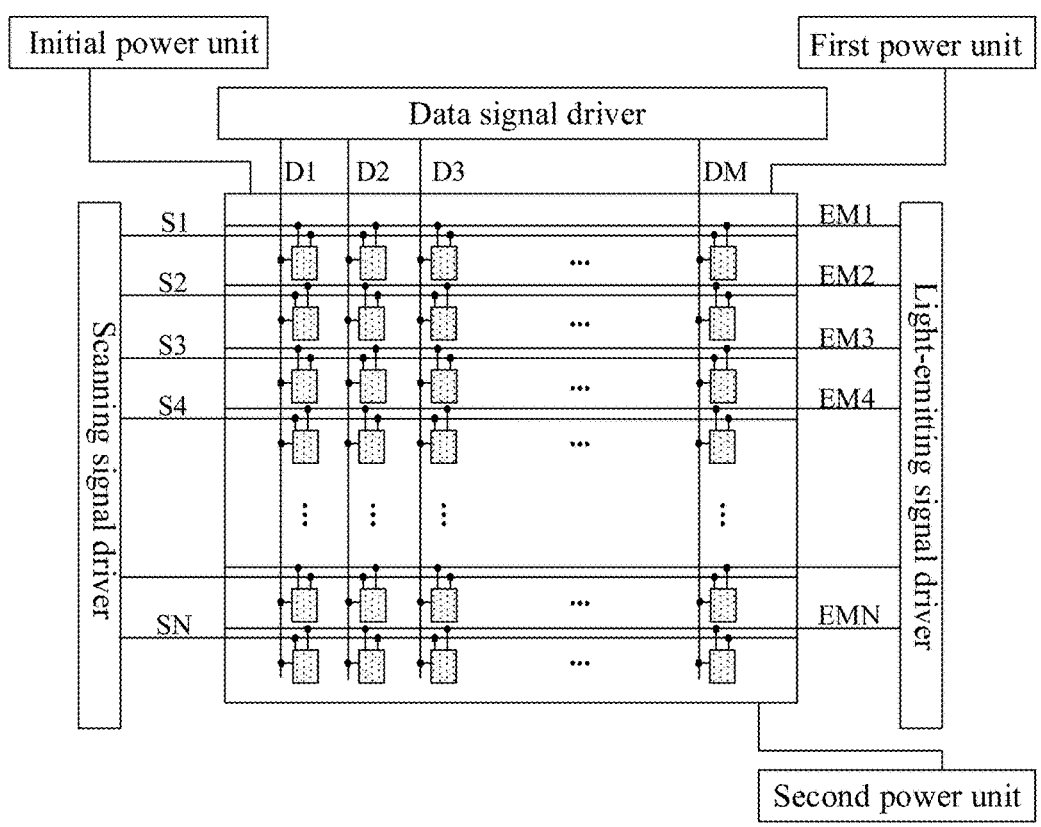
FIG. 1 is a schematic structural diagram of an OLED display device.

Description about the reference signs:
10—base substrate; 11—first insulating layer; 12—second insulating layer;
13—third insulating layer; 14—fourth insulating layer; 15—fifth insulating layer;
21—anode; 22—Pixel Defining Layer (PDL); 23—organic light-emitting layer;
24—cathode; 101—transistor; 102—storage capacitor;
103—driving structure layer; 104—light-emitting structure layer; 105—encapsulation structure layer;
200—display device; 300—first driving device; and 400—second driving device.

DETAILED DESCRIPTION

Implementation modes of the present disclosure may be implemented in various forms. Those of ordinary skill in the art can easily understand such a fact that implementation modes and contents may be transformed into various forms without departing from the purpose and scope of the present disclosure. Therefore, the present disclosure should not be explained as being limited to the contents recorded in the following implementation modes only. The embodiments in the present disclosure and the features in the embodiments can be freely combined without conflicts.

In the drawings, the size/sizes of composition elements, the thicknesses of layers, or regions may be exaggerated sometimes for clarity. Therefore, any implementation mode of the present disclosure is not always limited to the sizes shown in the drawings, and the shapes and sizes of the components in the drawings do not reflect the true scale. In addition, the drawings schematically illustrate ideal examples, and any implementation mode of the present disclosure is not limited to the shapes, numerical values, or the like shown in the drawings.

Ordinal numerals "first", "second", "third", etc., in the present disclosure are set not to form limits in number but only to avoid the confusion of composition elements.

In the present disclosure, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the implementation modes, and thus should not be understood as limits to the present disclosure. The positional relationships between the composition elements may be changed as appropriate according to the direction where the composition elements are described. Therefore, appropriate replacements based on situations are allowed, not limited to the expressions in the present disclosure.

In the present disclosure, unless otherwise specified and defined, terms "mounting", "mutual connection", and "connection" should be generally understood. For example, the term may be fixed connection, or detachable connection, or integral connection. The term may be mechanical connection or electric connection. The term may be direct connection, or indirect connection through an intermediate, or communication inside two elements. Those of ordinary skill in the art may understand the meanings of the terms in the present disclosure according to specific situations.

In the present disclosure, the transistor refers to an element that at least includes three terminals, i.e., a gate electrode, a drain electrode, and a source electrode. The transistor has a channel region between the drain electrode (or called a drain electrode terminal, drain region, or drain electrode) and the source electrode (or called a source electrode terminal, source region, or source electrode), and a current may flow through the drain electrode, the channel region, and the source region. In the present disclosure, the channel region refers to a main region that the current flows through.

In the present disclosure, the first electrode may be the drain electrode, and the second electrode may be the source electrode. Alternatively, the first electrode may be the source electrode, and the second electrode may be the drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present disclosure.

In the present disclosure, "electric connection" includes connection of the composition elements through an element with a certain electric action. "The element with the certain electric action" is not particularly limited as long as electric signals between the connected composition elements may be sent and received. "The element with the certain electric action" may be, for example, an electrode or wire, or a switch element such as a transistor, or another functional element such as a resistor, a reactor, or a capacitor.

In the present disclosure, "parallel" refers to a state that an angle formed by two straight lines is larger than −10° and smaller than 10°, and thus may also include a state that the angle is larger than −5° and smaller than 5°. In addition, "perpendicular" refers to a state that an angle formed by two straight lines is larger than 80° and smaller than 100°, and thus may also include a state that the angle is larger than 85° and smaller than 95°.

In the present disclosure, "film" and "layer" may be exchanged. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values in process and measurement error ranges are allowed.

FIG. 1 is a schematic structural diagram of an OLED display device. As shown in FIG. 1, the OLED display device may include a scanning signal driver, a data signal driver, a light-emitting signal driver, an OLED display substrate, a first power unit, a second power unit, and an initial power unit. In an exemplary implementation mode, the OLED display substrate at least includes multiple scanning signal lines (S1 to SN), multiple data signal lines (D1 to DM), and multiple light-emitting signal lines (EM1 to EMN). The scanning signal driver is arranged to sequentially provide scanning signals for the multiple scanning signal lines (S1 to SN). The data signal driver is arranged to provide data signals for the multiple data signal lines (D1 to DM). The light-emitting signal driver is arranged to sequentially provide light-emitting control signals for the multiple light-emitting signal lines (EM1 to EMN). In an exemplary implementation mode, the multiple scanning signal lines and the multiple light-emitting signal lines extend in a horizontal direction, and the multiple data signal lines extend in a vertical direction. The display device includes multiple light-emitting devices. At least one light-emitting device includes a pixel driving circuit and a light-emitting device. The pixel driving circuit is connected with a scanning signal line, a light-emitting control line, and a data signal line, and is arranged to, under the control of the scanning signal line and the light-emitting signal line, receive a data voltage transmitted by the data signal line and output a corresponding current to the light-emitting device. The light-emitting device is connected with the pixel driving circuit and arranged to emit light of corresponding brightness responsive to the current output by the pixel driving circuit. The first power unit, the second power unit, and the initial power unit are arranged to provide a first power voltage, a second power voltage, and an initial power voltage for the pixel driving circuit through a first power line, a second power line, and an initial signal line respectively.

Figure 2:
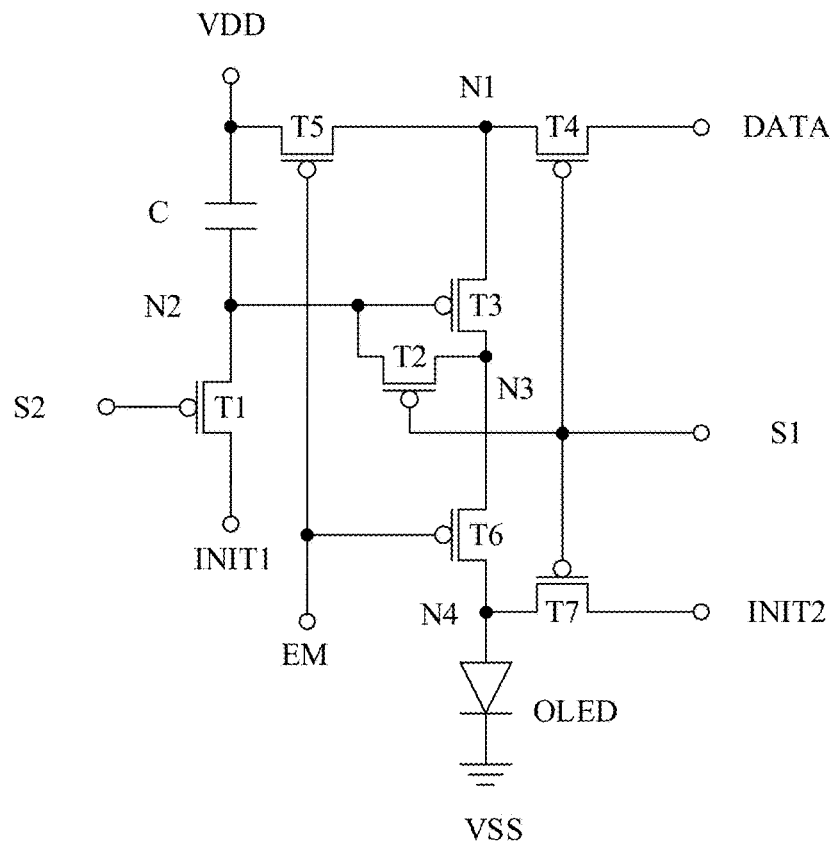
FIG. 2 is a schematic diagram of an equivalent circuit of a pixel driving circuit.

In an exemplary implementation mode, the pixel driving circuit may be of a 3T1C, 4T1C, 5T1C, 5T2C, 6T1C, or 7T1C structure. FIG. 2 is a schematic diagram of an equivalent circuit of a pixel driving circuit. As shown in FIG. 2, the pixel driving circuit may include seven switch transistors (a first transistor T1 to a seventh transistor T7), one storage capacitor C, and eight signal lines (a data signal line DATA, a first scanning signal line S1, a second scanning signal line S2, a first initial signal line INIT1, a second initial signal line INIT2, a first power line VSS, a second power line VDD, and a light-emitting signal line EM). The first initial signal line INIT1 and the second initial signal line INIT2 may be the same signal line.

In an exemplary implementation mode, a control electrode of the first transistor T1 is connected with the second scanning signal line S2, a first electrode of the first transistor T1 is connected with the first initial signal line INIT1, and a second electrode of the first transistor T1 is connected with a second node N2. A control electrode of the second transistor T2 is connected with the first scanning signal line S1, a first electrode of the second transistor T2 is connected with the second node N2, and a second electrode of the second transistor T2 is connected with a third node N3. A control electrode of the third transistor T3 is connected with the second node N2, a first electrode of the third transistor T3 is connected with a first node N1, and a second electrode of the third transistor T3 is connected with the third node N3. A control electrode of the fourth transistor T4 is connected with the first scanning signal line S1, a first electrode of the fourth transistor T4 is connected with the data signal line DATA, and a second electrode of the fourth transistor T4 is connected with the first node N1. A control electrode of the fifth transistor T5 is connected with the light-emitting signal line EM, a first electrode of the fifth transistor T5 is connected with the second power line VDD, and a second electrode of the fifth transistor T5 is connected with the first node N1. A control electrode of the sixth transistor T6 is connected with the light-emitting signal line EM, a first electrode of the sixth transistor T6 is connected with the third node N3, and a second electrode of the sixth transistor T6 is connected with a first electrode of the light-emitting device. A control electrode of the seventh transistor T7 is connected with the first scanning signal line S1, a first electrode of the seventh transistor T7 is connected with the second initial signal line INIT2, and a second electrode of the seventh transistor T7 is connected with the first electrode of the light-emitting device. A first end of the storage capacitor C is connected with the second power line VDD, and a second end of the storage capacitor C is connected with the second node N2.

In an exemplary implementation mode, the first transistor T1 to the seventh transistor T7 may be P-type transistors or N-type transistors. Adopting the same type of transistors in the pixel driving circuit may simplify the process flow, reduce the process difficulties of a display panel, and improve the yield of the product. In some possible implementation modes, the first transistor T1 to the seventh transistor T7 may include P-type transistors and N-type transistors.

In an exemplary implementation mode, a second electrode of the light-emitting device is connected with the first power line VSS. A signal of the first power line VSS is a low-level signal. A signal of the second power line VDD is a signal that keeps providing a high level. The first scanning signal line S1 is a scanning signal line in the pixel driving circuit of a present display row, and the second scanning signal line S2 is a scanning signal line in the pixel driving circuit of a previous display row. That is, for an nth display row, the first scanning signal line S1 is S(n), and the second scanning signal line S2 is S(n−1). The second scanning signal line S2 of the present display row and the first scanning signal line S1 in the pixel driving circuit of the previous display row are the same signal line. Signal lines of the display panel may be reduced, and the display panel has a narrow border.

Figure 3:
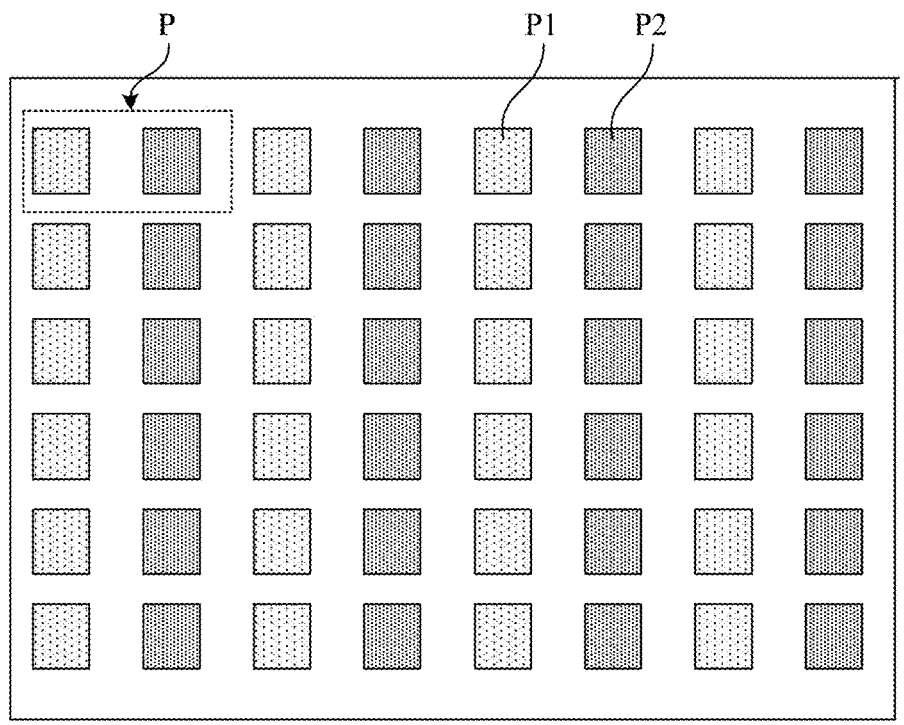
FIG. 3 is a schematic diagram of a plan view of structure of a display substrate according to an exemplary embodiment of the present disclosure.

FIG. 3 is a schematic diagram of a plan view of structure of a display substrate according to an exemplary embodiment of the present disclosure. As shown in FIG. 3, the display substrate may include multiple pixel units P arranged in a matrix. At least one of the multiple pixel units P includes a first sub-pixel P1 that emits first-color light and a second sub-pixel P2 that emits second-color light. Each of the first sub-pixel P1 and the second sub-pixel P2 includes a pixel driving circuit and a light-emitting device. In an exemplary implementation mode, a first light-emitting device P1 may include a Red (R) light light-emitting device, and a second light-emitting device P2 may include a Green (G) light light-emitting device. Alternatively, a first light-emitting device P1 may include a green light light-emitting device, and a second light-emitting device P2 may include a red light light-emitting device. In another exemplary implementation mode, a first light-emitting device P1 may include a Blue (B) light light-emitting device, and a second light-emitting device P2 may include a Green (G) light light-emitting device. Alternatively, a first light-emitting device P1 may include a green light light-emitting device, and a second light-emitting device P2 may include a blue light light-emitting device. In another exemplary implementation mode, a first light-emitting device P1 may include a Red (R) light light-emitting device, and a second light-emitting device P2 may include a Blue (B) light light-emitting device. Alternatively, a first light-emitting device P1 may include a blue light light-emitting device, and a second light-emitting device P2 may include a red light light-emitting device. No limits are made in the present disclosure. In an exemplary implementation mode, on a plane parallel to the display substrate, a sectional shape of the light-emitting device in the light-emitting unit may be a rectangle, a rhombus, a pentagon, or a hexagon, and the two light-emitting devices may be arranged in parallel horizontally or vertically or staggered. No limits are made in the present disclosure.

Figure 4:
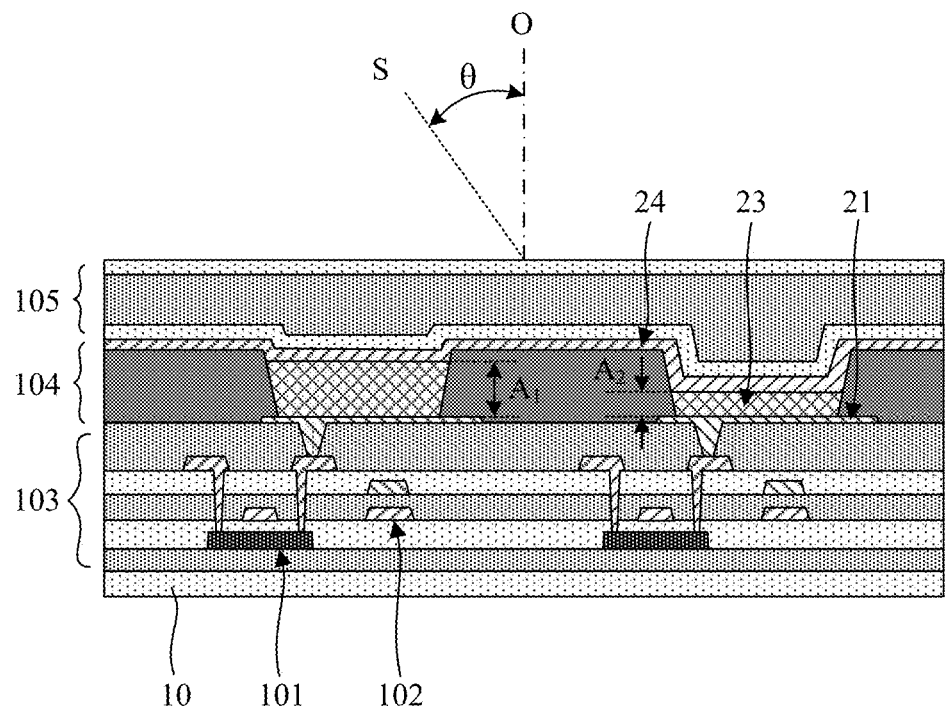
FIG. 4 is a schematic diagram of a sectional view of structure of a display substrate according to an exemplary embodiment of the present disclosure.

FIG. 4 is a schematic diagram of a sectional view of structure of a display substrate according to an exemplary embodiment of the present disclosure, and illustrates the structure of a light-emitting unit of the OLED display substrate. The light-emitting unit includes a first light-emitting device and a second light-emitting device. As shown in FIG. 4, on a plane perpendicular to the display substrate, the display substrate may include a driving structure layer 103 arranged on a base substrate 10, a light-emitting structure layer 104 arranged on a side of the driving structure layer 103 away from the base substrate 10, and an encapsulation structure layer 105 arranged on a side of the light-emitting structure layer 104 away from the base substrate 10. The light-emitting structure layer 104 of at least one light-emitting device may include an anode 21, an organic light-emitting layer 23, and a cathode 24. The organic light-emitting layer 23 is arranged between the anode 21 and the cathode 24.

In an exemplary implementation mode, the anode may include a reflecting electrode, the cathode may include a transflective electrode, and an OLED type top-light-emitting device is formed. The OLED type top-light-emitting device may structurally be considered as that a light source is arranged in an optical cavity structure formed by the reflecting electrode and the transflective electrode, light is continuously reflected to and fro in the optical cavity structure, a resonance effect of a micro cavity may be achieved, and an intensification effect of light of a specific wavelength in emitted light is further achieved, i.e., a micro-cavity effect. Each light-emitting device in the OLED display substrate has such an optical interference cavity, and a distance between an anode for reflecting light and a cathode for reflecting and transmitting light is called a micro-cavity length. In an exemplary implementation mode, the micro-cavity length may be a thickness of the organic light-emitting layer between the anode and the cathode. Light directly emitted by the light-emitting layer and light reflected by the reflecting electrode mutually interfere under the strong reflection effect of the reflecting electrode, so that not only may a spectrum of light in the vicinity of a wavelength corresponding to a resonant wavelength of the micro-cavity length be broadened to further improve the color purity and the color gamut, but also the light intensity of the light in the vicinity of the wavelength corresponding to the resonant wavelength of the micro-cavity length may be increased to further improve the brightness.

In an exemplary implementation mode, the micro-cavity effect of each light-emitting device is required to meet $\delta=2j(\lambda/2)-2nd\cos\beta$, where $\delta$ is a micro-cavity phase difference, j is an integer, $\lambda$ is a wavelength of the light emitted by the light-emitting device, n is an average reflective index of the organic light-emitting layer in the micro-cavity, d is the micro-cavity length, and $\beta$ is a reflection angle. It can be seen from the formula of the micro-cavity optical path difference that the micro-cavity length d is positively proportional to the wavelength $\lambda$ of the emitted light, and the distance between the anode and cathode in the light-emitting device or the thickness of the organic light-emitting layer (i.e., the micro-cavity length) may be designed to intensify the emitted light in the vicinity of the wavelength corresponding to the resonant wavelength of the micro-cavity length in each light-emitting device.

In an exemplary implementation mode, a ratio of a first micro-cavity length $A_1$ of the first light-emitting device (i.e., a thickness of the organic light-emitting layer in the first light-emitting device) and a second micro-cavity length $A_2$ of the second light-emitting device (i.e., a thickness of the organic light-emitting layer in the second light-emitting device) may be about 1.24K to 1.63K. $K=\lambda_1/\lambda_2$, where $\lambda_1$ is a wavelength of the first-color light emitted by the first light-emitting device, and $\lambda_2$ is a wavelength of the second-color light emitted by the second light-emitting device. The ratio of the micro-cavity lengths of the first light-emitting device and the second light-emitting device may be set to make the display substrate display different colors when a viewer views the light-emitting unit at different view angles $\theta$. The view angle $\theta$ refers to an included angle between a light of sight S of the viewer for viewing the display substrate and a normal O of a viewing region in the display substrate. For example, when the viewer views the light-emitting unit in a first view angle range smaller than a first view angle, the display substrate including the first light-emitting device that emits the first-color light and the second light-emitting device that emits the second-color light displays a second color. When the viewer views the light-emitting unit in a second view angle range larger than a second view angle, the display substrate including the first light-emitting device that emits the first-color light and the second light-emitting device that emits the second-color light displays a first color. When the viewer views the light-emitting unit in a third view angle range larger than the first view angle and smaller than the second view angle, the display substrate including the first light-emitting device and the second light-emitting device displays a third color, namely the display substrate displays a synthetic color of the first color and the second color.

In an exemplary implementation mode, the viewer viewing the light-emitting unit at different view angles $\theta$ may be the same observer who views at different view angles $\theta$ respectively, or may be different observers who view at different view angles $\theta$ respectively at the same time.

In an exemplary implementation mode, the first view angle may be about 15° to 20°, and the second view angle may be about 50° to 55°.

In an exemplary implementation mode, the first view angle range may be 0° to 15°, the second view angle range may be 55° to 65°, and the third view angle range may be 25° to 40°.

In some exemplary implementation modes, the ratio of the first micro-cavity length $A_1$ of the first light-emitting device and the second micro-cavity length $A_2$ of the second light-emitting device may be about 1.36K to 1.49K.

In some other exemplary implementation modes, the ratio of the first micro-cavity length $A_1$ of the first light-emitting device and the second micro-cavity length $A_2$ of the second light-emitting device may be about 1.43K.

In an exemplary implementation mode, the first-color light includes red light, the first light-emitting device includes a red light light-emitting device that emits red light, the second-color light includes green light, and the second light-emitting device includes a green light light-emitting device that emits green light. That is, the light-emitting unit in the exemplary embodiment of the present disclosure consists of a red light light-emitting device and a green light light-emitting device.

In a display substrate of a conventional structure, a light-emitting unit usually includes a red light light-emitting device that emits red light, a green light light-emitting device that emits green light, and a blue light light-emitting device that emits blue light, and a micro-cavity length of each light-emitting device may be set according to a wavelength of the emitted light. For example, the micro-cavity length of the red light light-emitting device may be determined according to a certain wavelength value from wavelengths 600 nm to 650 nm, and the determined micro-cavity length is called a red light reference cavity length $L_R$. The micro-cavity length of the green light light-emitting device may be determined according to a certain wavelength value from wavelengths 500 nm to 550 nm, and the determined micro-cavity length is called a green light reference cavity length $L_G$. It can be seen from the formula of the micro-cavity optical path difference that the red light reference cavity length $L_R$ is larger than the green light reference cavity length $L_G$ because the wavelength of the red light is larger than the wavelength of the green light. In an exemplary implementation mode, the red light reference cavity length $L_R$ is about 1.1 to 1.3 times the green light reference cavity length $L_G$. For example, the green light reference cavity length $L_G$ is determined according to wavelength 530 nm, and the red light reference cavity length $L_R$ is determined according to wavelength 630 nm. In such case, the red light reference cavity length $L_R$ is about 1.2 times the green light reference cavity length $L_G$. By determining the micro-cavity lengths like this, during displaying, the red light light-emitting device may emit intensified red light through a strong micro-cavity effect, the green light light-emitting device may emit intensified green light through a strong micro-cavity effect, and the blue light light-emitting device may emit intensified blue light through a strong micro-cavity effect. The display substrate displays a color required to be presented by controlling the brightness ratio of the red light, the green light, and the blue light through Gamma. Since the micro-cavity length is a control parameter under a certain view angle, the brightness ratio of the light-emitting device under another view angle may change with the view angle, to result in a color deviation. Research shows that such a color deviation is inevitable under the limit of the structure of the OLED type light-emitting device. The display substrate of the conventional structure eliminates the color deviation as much as possible by structural optimization.

The display substrate disclosed in the exemplary embodiment of the present disclosure uses the color deviation in a manner of amplifying the color deviation to make a picture displayed by the display substrate in different colors when viewed at different view angles.

In the exemplary embodiment of the present disclosure, a red light micro-cavity length of the red light light-emitting device may be set to be about 1.18 to 1.29 times the red light reference cavity length $L_R$, and a green light micro-cavity length of the green light light-emitting device may be set to be about 0.79 to 0.95 times the green light reference cavity length $L_G$. That is, the red light micro-cavity length of the red light light-emitting device is about $1.24\lambda_R/\lambda_G$ to $1.63\lambda_R/\lambda_G$ times the green light micro-cavity length. Herein, $\lambda_R$ is the wavelength of the red light emitted by the red light light-emitting device, and $\lambda_G$ is the wavelength of the green light emitted by the green light light-emitting device.

When $\lambda_R/\lambda_G=1.2$, the red light micro-cavity length of the red light light-emitting device is about 1.49 to 1.96 times the green light micro-cavity length of the green light light-emitting device. By such a setting, the display substrate including the red light light-emitting device and the green light light-emitting device displays green when the viewer views the light-emitting unit at a view angle ranging from 0° to 15°, the display substrate including the red light light-emitting device and the green light light-emitting device displays yellow when the viewer views the light-emitting unit at a view angle ranging from 25° to 40°, and the display substrate including the red light light-emitting device and the green light light-emitting device displays red when the viewer views the light-emitting unit at a view angle ranging from 55° to 65°. Therefore, the display substrate displays different colors when the viewer views the light-emitting unit at different view angles θ.

In some possible implementation modes, the red light micro-cavity length of the red light light-emitting device may be set to be about 1.22 to 1.25 times the red light reference cavity length $L_R$, and the green light micro-cavity length of the green light light-emitting device may be set to be about 0.84 to 0.90 times the green light reference cavity length $L_G$. That is, the red light micro-cavity length of the red light light-emitting device is about $1.36\lambda_R/\lambda_G$ to $1.49\lambda_R/\lambda_G$ times the green light micro-cavity length of the green light light-emitting device. When $\lambda_R/\lambda_G=1.2$, the red light micro-cavity length of the red light light-emitting device is about 1.63 to 1.79 times the green light micro-cavity length of the green light light-emitting device.

In some other possible implementation modes, the red light micro-cavity length of the red light light-emitting device may be set to be about 1.25 times the red light reference cavity length $L_R$, and the green light micro-cavity length of the green light light-emitting device may be set to be about 0.87 times the green light reference cavity length $L_G$. That is, the red light micro-cavity length of the red light light-emitting device is about $1.43\lambda_R/\lambda_G$ times the green light micro-cavity length of the green light light-emitting device. When $\lambda_R/\lambda_G=1.2$, the red light micro-cavity length of the red light light-emitting device is about 1.71 times the green light micro-cavity length of the green light light-emitting device.

In an exemplary implementation mode, the red light micro-cavity length of the red light light-emitting device may be determined according to wavelength 630 nm. The red light micro-cavity length may be about 340 nm to 370 nm. For example, the red light micro-cavity length may be about 355 nm. The green light micro-cavity length of the green light light-emitting device may be determined according to wavelength 530 nm. The green light micro-cavity length may be about 190 nm to 230 nm. For example, the green light micro-cavity length may be about 210 nm.

Figure 5:
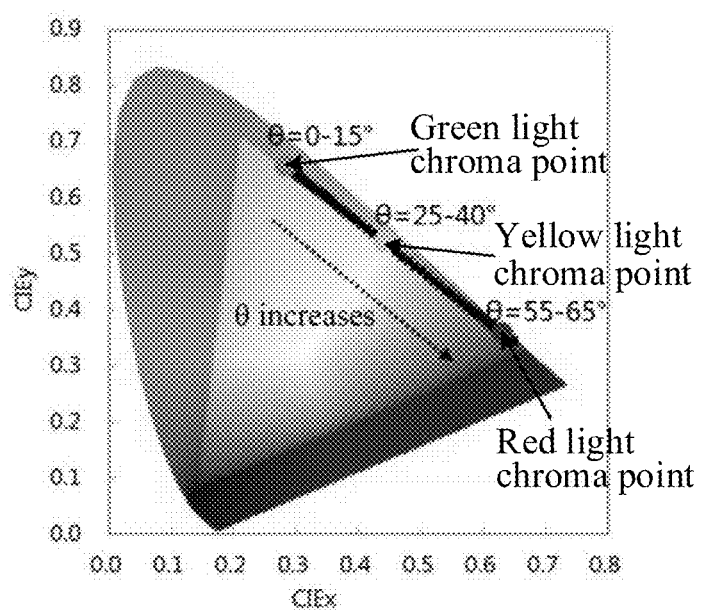
FIG. 5 is a schematic diagram of chroma of a display substrate under different view angles according to an exemplary embodiment of the present disclosure.

FIG. 5 is a schematic diagram of chroma of a display substrate under different view angles according to an exemplary embodiment of the present disclosure. A CIE1931 color space is adopted. The display substrate may include multiple light-emitting units arranged in a matrix. Each light-emitting unit includes a red light light-emitting device and a green light light-emitting device. As shown in FIG. 5, the display of the display substrate changes from a green picture to a yellow picture and then to a red picture when the view angle θ changes from 0° to 90°. A color trajectory is a straight line connecting a red light chroma point, a yellow light chroma point, and a green light chroma point. Main colors involved in the changing process of the view angle mainly include green, yellow, and red, and the angle tolerance is relatively high for the display of each color. The display substrate presents green when the view angle θ changes from 0° to 15°. For example, color coordinates at view angle θ=0° are about (0.285, 0.656). The display substrate presents yellow when the view angle θ changes from 25° to 40°. For example, color coordinates at view angle θ=35° are about (0.441, 0.521). The display substrate presents red when the view angle θ changes from 55° to 65°. For example, color coordinates at view angle θ=60° are about (0.632, 0.358).

Figure 6:
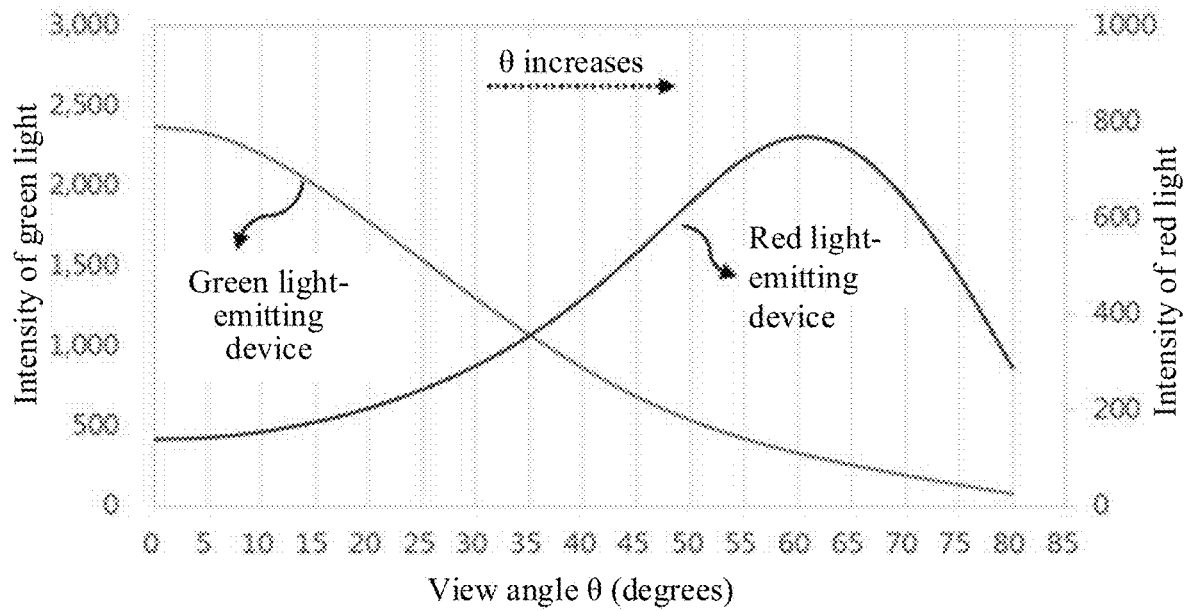
FIG. 6 is a schematic diagram of a brightness changing trend of a red light light-emitting device and green light light-emitting device in a display substrate under different view angles according to an exemplary embodiment of the present disclosure.

FIG. 6 is a schematic diagram of a brightness changing trend of a red light light-emitting device and green light light-emitting device in a display substrate under different view angles according to an exemplary embodiment of the present disclosure. The brightness of the red light emitted by the red light light-emitting device gradually increases with the enlargement of the view angle θ, and starts decaying from a maximum value when the view angle θ is about 60°. The brightness of the green light emitted by the green light light-emitting device is maximum when the view angle θ is about 0°, and gradually decreases with the enlargement of the view angle θ.

As shown in FIGS. 5 and 6, when the view angle θ is 0°, the brightness of the green light emitted by the green light light-emitting device is about 2,500 nit, and the brightness of the red light emitted by the red light light-emitting device is about 140 nit. Since the brightness of the red light is relatively low, synthetic light of the red light light-emitting device and the green light light-emitting device is still green light, the display picture is a green picture, corresponding color coordinates are (0.285, 0.656), and a position on the chroma diagram shown in FIG. 5 is a green light chroma point. When the view angle θ is 35°, the brightness of the green light emitted by the green light light-emitting device is about 1,100 nit, and the brightness of the red light emitted by the red light light-emitting device is about 355 nit. Since the brightness of the red light and the green light is close, synthetic light of the red light light-emitting device and the green light light-emitting device is yellow light, the display picture is a yellow picture, corresponding color coordinates are (0.441, 0.521), and a position on the chroma diagram shown in FIG. 5 is a yellow light chroma point. When the view angle θ is 60°, the brightness of the green light emitted by the green light light-emitting device is about 335 nit, and the brightness of the red light emitted by the red light light-emitting device is about 770 nit. Since the brightness of the red light is far higher than that of the green light, synthetic light of the red light light-emitting device and the green light light-emitting device is red light, the display picture is a red picture, corresponding color coordinates are (0.632, 0.358), and a position on the chroma diagram shown in FIG. 5 is a red light chroma point.

Figure 7:
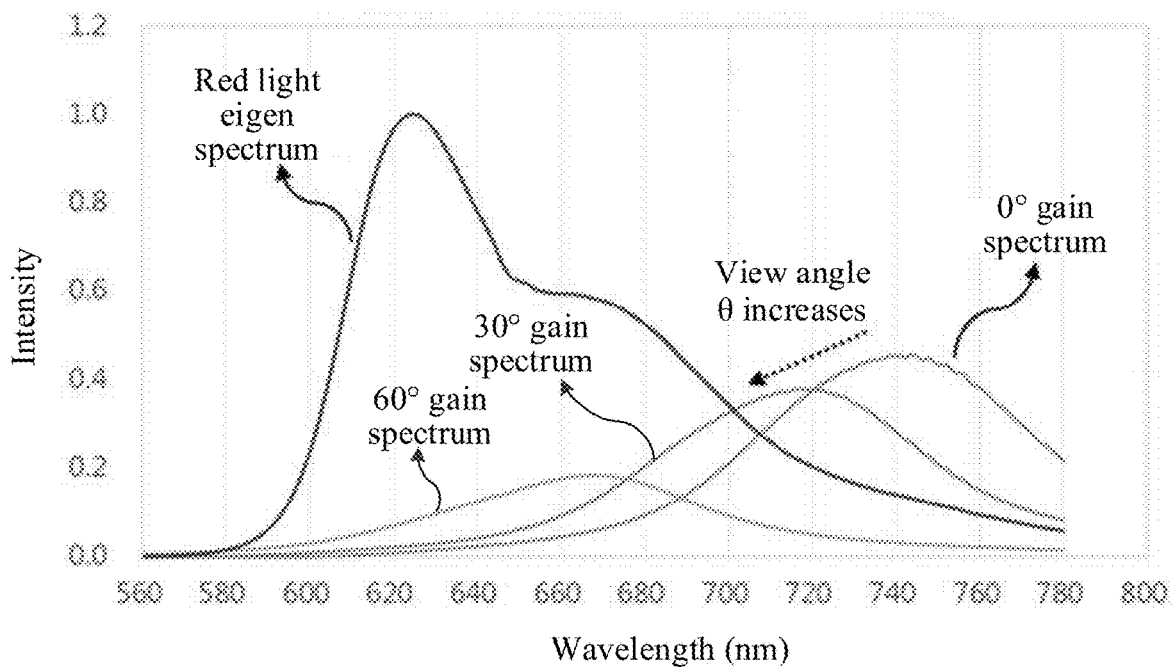
FIG. 7 is a gain spectrogram of a red light light-emitting device in a display substrate according to an exemplary embodiment of the present disclosure.

FIG. 7 is a gain spectrogram of a red light light-emitting device in a display substrate according to an exemplary embodiment of the present disclosure. The red light micro-cavity length of the red light light-emitting device is set to be about 1.25 times the red light reference cavity length $L_R$. A relative positional relationship between an eigen spectrum and micro-cavity gain spectrum of the red light light-emitting device is shown in FIG. 7. The micro-cavity gain spectrum is on the rightmost side of the red light eigen spectrum when the view angle θ is 0°, and gradually moves to the direction of a small wavelength with the enlargement of the view angle. By such an optical structure design of the red light light-emitting device, a changing trend of the brightness of the red light emitted by the red light light-emitting device with the view angle is eventually as shown in FIG. 6. That is, the brightness of the red light emitted by the red light light-emitting device gradually increases with the enlargement of the view angle, and is maximum at about 60°.

Figure 8:
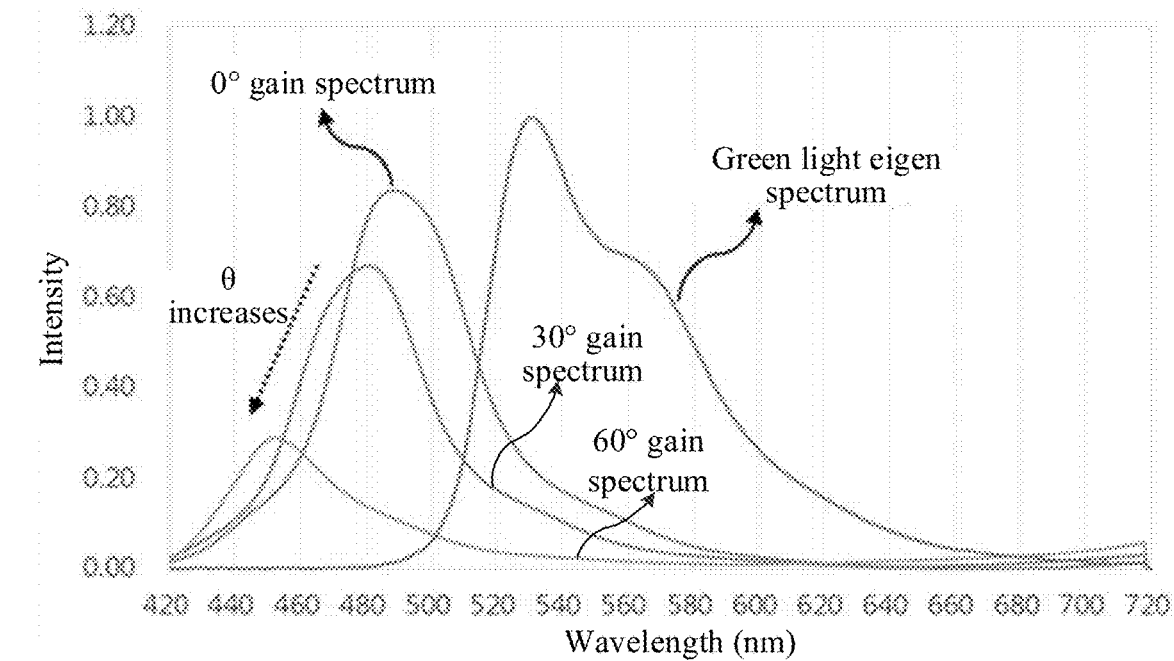
FIG. 8 is a gain spectrogram of a green light light-emitting device in a display substrate according to an exemplary embodiment of the present disclosure.

FIG. 8 is a gain spectrogram of a green light light-emitting device in a display substrate according to an exemplary embodiment of the present disclosure. The green light micro-cavity length of the green light light-emitting device is set to be about 0.87 times the green light reference cavity length $L_G$. A relative positional relationship between an eigen spectrum and micro-cavity gain spectrum of the green light light-emitting device is shown in FIG. 8. The micro-cavity gain spectrum is on the leftmost side of the green light eigen spectrum when the view angle θ is 0°, and gradually moves to the direction of a small wavelength with the enlargement of the view angle. By such an optical structure design of the green light light-emitting device, a changing trend of the brightness of the green light emitted by the green light light-emitting device with the view angle is eventually maximum at about 0°, as shown in FIG. 6. That is, the brightness of the green light emitted by the green light light-emitting device gradually decreases with the enlargement of the view angle.

Figure 9:
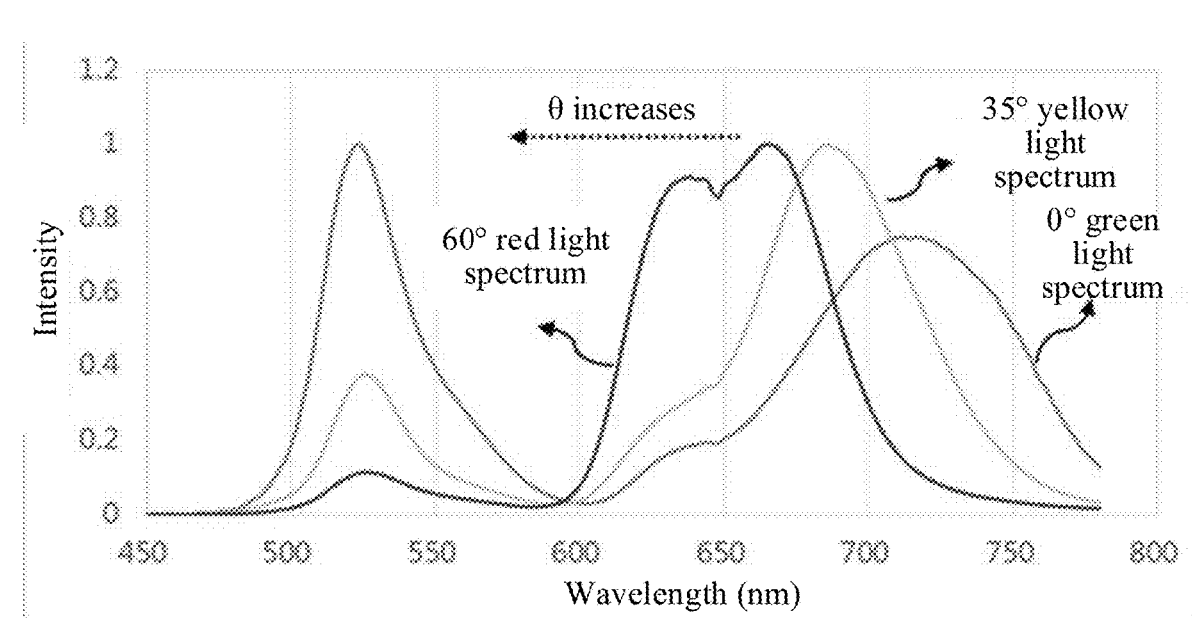
FIG. 9 is a spectrogram of light emitted by a display substrate according to an exemplary embodiment of the present disclosure.

FIG. 9 is a spectrogram of light emitted by a display substrate according to an exemplary embodiment of the present disclosure. As shown in FIG. 9, in the vicinity of view angle θ=0°, the brightness of the green light emitted by the green light light-emitting device is relatively high, the brightness of the red light emitted by the red light light-emitting device is relatively low, the synthetic light is green light, the display picture of the display substrate is a green picture, and the corresponding color coordinates are about (0.285, 0.656). In the vicinity of view angle θ=35°, the brightness of the green light emitted by the green light light-emitting device is close to the brightness of the red light emitted by the red light light-emitting device, the synthetic light is yellow light, the display picture of the display substrate is a yellow picture, and the corresponding color coordinates are about (0.441, 0.521). In the vicinity of view angle θ=60°, the brightness of the green light emitted by the green light light-emitting device is relatively low, the brightness of the red light emitted by the red light light-emitting device is relatively high, the synthetic light is red light, the display picture of the display substrate is a red picture, and the corresponding color coordinates are about (0.632, 0.358).

A preparation process of the display substrate will be exemplarily described below. A "patterning process" mentioned in the present disclosure includes coating with a photoresist, mask exposure, development, etching, photoresist stripping, and other treatment for a metal material, an inorganic material, or a transparent conductive material, and includes coating with an organic material, mask exposure, development, and other treatment for the organic material. Deposition may be any one or more of sputtering, evaporation, and chemical vapor deposition. Coating may be any one or more of spray coating, spin coating, and ink-jet printing. Etching may be any one or more of dry etching and wet etching. No limits are made in the present disclosure.

"Thin film" refers to a layer of thin film made from a certain material on a base substrate by deposition or another process. If the patterning process is not needed by the "thin film" in the whole making process, the "thin film" may also be called a "layer". When the patterning process is needed by the "thin film" in the whole making process, the thin film is called a "thin film" before the patterning process and called a "layer" after the patterning process. The "layer" after the patterning process includes at least one "pattern". "A and B are arranged in the same layer" mentioned in the present disclosure refers to that A and B are simultaneously formed by the same patterning process. The "thickness" of the film layer is a size of the film layer in a direction perpendicular to the display substrate. In the exemplary embodiment of the present disclosure, "the orthographic projection of A includes the orthographic projection of B" refers to that a boundary of the orthographic projection of B falls within a range of a boundary of the orthographic projection of A or the boundary of the orthographic projection of A is overlapped with the boundary of the orthographic projection of B.

In an exemplary implementation mode, the preparation process of the display substrate includes the following operations.

(1) A base substrate is formed on a glass carrier plate. In an exemplary implementation mode, the operation that a base substrate is formed on a glass carrier plate may include the following operations. The glass carrier plate 1 is coated with a first flexible-material thin film, and a first flexible layer is formed after curing. A surface of a side of the first flexible layer away from the glass carrier plate is coated with a second flexible-material thin film, and a second flexible layer is formed after curing. A surface of a side of the second flexible layer away from the glass carrier plate is coated with a third flexible-material thin film, and a third flexible layer is formed after curing. The flexible base substrate is formed on the glass carrier plate, including the first flexible layer, second flexible layer, and third flexible layer which are stacked. In the exemplary implementation mode, the first flexible layer, the second flexible layer, and the third flexible layer may be made of the same material or different materials. In some possible implementation modes, the material of the first flexible layer includes a Pressure Sensitive Adhesive (PSA), and the material of each of the second flexible layer and the third flexible layer includes polyimide (PI).

In another exemplary implementation mode, the operation that a base substrate is formed on a glass carrier plate 1 may include the following operations. The glass carrier plate is coated with a first flexible-material thin film, and a first flexible layer is formed after curing. Then, a first inorganic-material thin film is deposited on the first flexible layer to form a first inorganic layer covering the first flexible layer. Next, an amorphous silicon (a-si) thin film is deposited on the first inorganic layer to form an amorphous silicon layer covering the first inorganic layer. Later on, the amorphous silicon layer is coated with a second flexible-material thin film, and a second flexible layer is formed after curing. Finally, a second inorganic-material thin film is deposited on the second flexible layer to form a second barrier layer covering the second flexible layer. The flexible base substrate is formed on the glass carrier plate, including the first flexible layer, first inorganic layer, semiconductor layer, second flexible layer, and second inorganic layer which are stacked. In the exemplary implementation mode, the materials of the first, second, and third flexible-material thin films may be polyimide (PI), polyethylene terephthalate (PET), a Pressure Sensitive Adhesive (PSA), a polymer soft material subjected to surface treatment, or other materials. The first and second inorganic-material thin films may be made of materials such as silicon nitride (SiNx) or silicon oxide (SiOx), and are used to improve the water and oxygen resistance of the base substrate. The first and second inorganic layers are called first and second barrier layers. The material of the semiconductor layer may be amorphous silicon (a-si).

Figure 10:
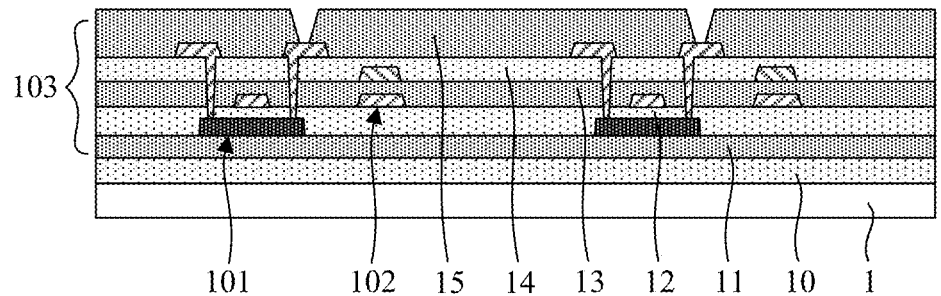
FIG. 10 is a schematic diagram after a pattern of a driving structure layer is formed according to an exemplary embodiment of the present disclosure.

(2) A pattern of a driving structure layer is formed on the base substrate, as shown in FIG. 10. In an exemplary implementation mode, the driving structure layer may include multiple transistors forming a pixel driving circuit and a storage capacitor. FIG. 10 illustrates a driving structure layer of a light-emitting unit (including two light-emitting devices). The driving structure layer of each light-emitting device is illustrated taking one transistor and one storage capacitor as an example. In the exemplary implementation mode, a preparation process of the driving structure layer may include the following operations.

A first insulating thin film and a semiconductor layer thin film are sequentially deposited on the base substrate 10. The semiconductor layer thin film is patterned through a patterning process to form a first insulating layer 11 covering the whole base substrate 10 and a pattern of the semiconductor layer arranged on the first insulating layer 11. The pattern of the semiconductor layer at least includes an active layer arranged in each light-emitting device. In the exemplary implementation mode, the present patterning process is called a first patterning process.

Then, a second insulating thin film and a first metal thin film are sequentially deposited. The first metal thin film is patterned through a patterning process to form a second insulating layer 12 covering the pattern of the semiconductor layer and a pattern of a first metal layer arranged on the second insulating layer 12. The pattern of the first metal layer at least includes a gate electrode and first capacitor electrode arranged in each light-emitting device. In the exemplary implementation mode, the present patterning process is called a second patterning process.

Then, a third insulating thin film and a second metal thin film are sequentially deposited. The second metal thin film is patterned through a patterning process to form a third insulating layer 13 covering the first metal layer and a pattern of a second metal layer arranged on the third insulating layer 13. The pattern of the second metal layer at least includes a second capacitor electrode arranged in each light-emitting device. A position of the second capacitor electrode corresponds to that of the first capacitor electrode. In the exemplary implementation mode, the present patterning process is called a third patterning process.

Then, a fourth insulating thin film is deposited. The fourth insulating thin film is patterned through a patterning process to form a pattern of a fourth insulating layer 14 covering the second metal layer. Multiple via patterns are formed on the fourth insulating layer 14, and at least include two first vias formed in each light-emitting device. Positions of the two first vias correspond to positions of two ends of the active layer respectively. The fourth insulating layer 14, third insulating layer 13, and second insulating layer 12 in the two first vias are etched away to expose the surface of the active layer. In the exemplary implementation mode, the present patterning process is called a fourth patterning process.

Then, a third metal thin film is deposited. The third metal thin film is patterned through a patterning process to form a pattern of a third metal layer on the fourth insulating layer 14. The pattern of the third metal layer at least includes a source electrode and drain electrode arranged in each light-emitting device. The source electrode and the drain electrode are connected with the active layer through the first vias respectively such that a conductive channel is formed between the source electrode and the drain electrode. In the exemplary implementation mode, the present patterning process is called a fifth patterning process.

Then, coating with a layer of planar (PLN) thin film is performed to form a fifth insulating layer 15 covering the whole base substrate 10. A via pattern is formed on the fifth insulating layer 15 through a patterning process. The via pattern at least includes a second via formed in each light-emitting device. The fifth insulating layer 15 in the second via is removed to expose the surface of the drain electrode. In the exemplary implementation mode, the present patterning process is called a sixth patterning process. The fifth insulating layer 15 may be a planar (PLN) layer. A surface of a side of the planar layer away from the base substrate 10 is a straight surface. The planar layer may be made of a resin or other materials.

At this point, the formed structure includes the base substrate 10 arranged on the glass carrier plate 1 and the driving structure layer 103 arranged on the base substrate 10, as shown in FIG. 10. The active layer, the gate electrode, the source electrode, and the drain electrode form a transistor 101. The first capacitor electrode and the second capacitor electrode form a storage capacitor 102. In an exemplary implementation mode, the transistor 101 may be a drive transistor in the pixel driving circuit. The drive transistor may be a Thin Film Transistor (TFT).

In an exemplary implementation mode, the first insulating thin film, the second insulating layer, the third insulating layer, and the fourth insulating thin film may be made of any one or more of silicon oxide (SiOx), silicon nitride (SiNx), and silicon oxynitride (SiON), and may be single-layer, multilayer, or composite. The first insulating layer is called a buffer layer and used to improve the water and oxygen resistance of the base substrate. The second insulating layer and the third insulating layer are called Gate Insulator (GI) layers. The fourth insulating layer is called an Interlayer Dielectric (ILD) layer. The first metal thin film, the second metal thin film, and the third metal thin film may be made of metal materials, e.g., any one or more of Argentum (Ag), Copper (Cu), Aluminum (Al), Titanium (Ti), and Molybdenum (Mo), or alloy materials of the abovementioned metals, e.g., an Aluminum-Neodymium alloy (AlNd) or a Molybdenum-Niobium alloy (MoNb), and may be single-layer structures, or multilayer composite structures such as Ti/Al/Ti. The active layer thin film may be made of amorphous Indium Gallium Zinc Oxide (a-IGZO), zinc oxynitride (ZnON), indium zinc tin oxide (IZTO), amorphous silicon (a-si), polysilicon (p-Si), sexithiophene, polythiophene, or other materials. That is, the present disclosure is applied to a transistor manufactured based on an oxide technology, a silicon technology, or an organic matter technology.

Figure 11:
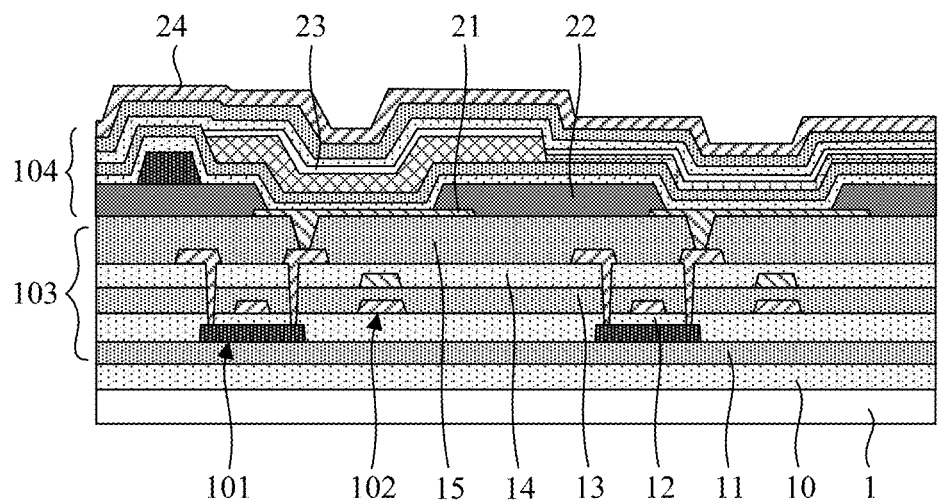
FIG. 11 is a schematic diagram after a pattern of a light-emitting structure layer is formed according to an exemplary embodiment of the present disclosure.

(3) a light-emitting structure layer is formed on the driving structure layer, as shown in FIG. 11. In the exemplary implementation mode, the operation that a light-emitting structure layer is formed on the driving structure layer may include the following operations.

A conductive thin film is deposited on the base substrate where the abovementioned patterns are formed, and the conductive thin film is patterned through a patterning process to form a pattern of a conductive layer. The pattern of the conductive layer at least includes an anode 21 arranged in each light-emitting device. The anode 21 is connected with the drain electrode of the first transistor 101 through the second via. In the exemplary implementation mode, the present patterning process is called a seventh patterning process. In the exemplary implementation mode, the conductive thin film may adopt a single layer of a transparent conductive material, e.g., indium tin oxide (ITO) or indium zinc oxide (IZO). Alternatively, the conductive thin film may adopt a composite layer of a metal material and a transparent conductive material, e.g., Ag/ITO, Ag/IZO, or ITO/Ag/ITO. The thickness of the metal layer in the anode may be about 80 nm to 100 nm. The thickness of the transparent conductive material in the anode may be about 5 nm to 20 nm, so that the average reflectivity of the anode in a visible light region is about 85% to 95%.

The base substrate where the abovementioned patterns are formed is coated with a pixel defining thin film, and mask exposure and development are performed on the pixel defining thin film through a patterning process to form a Pixel Defining Layer (PDL) 22. In each light-emitting device, a pixel opening is formed on the pixel defining layer 22, and the pixel defining thin film in the pixel opening is developed away to expose the surface of the anode 21. In the exemplary implementation mode, the shape of the pixel opening may be a square, a rectangle, a round, an ellipse, a hexagon, or the like in a plane parallel to the base substrate, and may be set as practically required. No limits are made in the present disclosure. In the exemplary implementation mode, the present patterning process is called an eighth patterning process. In the exemplary implementation mode, the pixel defining thin film may be made from a material such as polyimide, acrylic, or polyethylene terephthalate.

The base substrate where the abovementioned patterns are formed is coated with an organic-material thin film, and mask exposure and development are performed on the organic-material thin film through a patterning process to form multiple Photo Spacer (PS) patterns. In the exemplary implementation mode, the present patterning process is called a ninth patterning process.

An organic light-emitting layer 23 and a cathode 24 are sequentially formed on the base substrate where the abovementioned patterns are formed. The organic light-emitting layer 23 is connected with the anode 21 in the pixel opening. The cathode 24 is formed on the organic light-emitting layer 23 and connected with the organic light-emitting layer 23. The cathodes 24 of multiple light-emitting devices are integrated. In the exemplary implementation mode, the cathode is made of a metal material, e.g., Magnesium (Mg), Argentum (Ag), or Aluminum (Al), or an alloy material, e.g., an alloy of Mg:Ag, a ratio of Mg:Ag being about 9:1 to 1:9. The thickness of the cathode may be about 10 nm to 20 nm, so that the average transmittance of the cathode at wavelength 530 nm is about 50% to 60%.

At this point, the preparation of the pattern of the light-emitting structure layer 104 on the driving structure layer 103 is completed, as shown in FIG. 11. In the exemplary implementation mode, the anode 21, organic light-emitting layer 23, and cathode 24 in the light-emitting structure layer 104 form an OLED type light-emitting device. The organic light-emitting layer 23 is driven by the anode 21 and the cathode 24 to emit light of a corresponding gray-scale.

In the exemplary implementation mode, the organic light-emitting layer 23 in the OLED type light-emitting device may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL).

In the exemplary implementation mode, the light-emitting layers in two light-emitting devices are different. The red light light-emitting device includes a red light light-emitting layer, and the green light light-emitting device includes a green light light-emitting layer. In order to reduce the process difficulties and improve the yield, the hole injection layer and hole transport layer on one side of the light-emitting layer may adopt connected layers, and the electron injection layer and electron transport layer on the other side of the light-emitting layer may adopt connected layers. In the exemplary implementation mode, any one or more of the hole injection layer, the hole transport layer, the electron injection layer, and the electron transport layer may be made by one process (one evaporation process or one ink-jet printing process) but isolated through segment gaps of the surfaces of the formed film layers or by surface treatment and other means. For example, any one or more of the hole injection layers, hole transport layers, electron injection layers, and electron transport layers corresponding to adjacent light-emitting devices may be isolated. In the exemplary implementation mode, the organic light-emitting layer may be prepared by evaporation through a Fine Metal Mask (FMM) or an open mask or by an ink-jet process.

In the exemplary implementation mode, the OLED type light-emitting device may be prepared by the following preparation method. The hole injection layer and the hole transport layer are sequentially evaporated at first using the open mask to form connected layers of the hole injection layer and the hole transport layer on the display substrate. That is, the hole injection layers of all the light-emitting devices are connected, and the hole transport layers of all the light-emitting devices are connected. The hole injection layer and the hole transport layer are substantially the same in area but different in thickness. Then, the fine metal mask is used to evaporate the electron block layer and the red light light-emitting layer are evaporated on the red light light-emitting device and evaporate the electron block layer and the green light light-emitting layer on the green light light-emitting device. The electron block layers and light-emitting layers of adjacent light-emitting devices may be overlapped by a small portion (for example, the overlapping portion is less than 10% of the area of the pattern of the respective light-emitting layer), or may be isolated. Then, the hole block layer, the electron transport layer, the electron injection hole, and the cathode are sequentially evaporated using the open mask to form connected layers of the hole block layer, the electron transport layer, the electron injection layer, and the cathode on the display substrate. That is, the hole block layers of all the light-emitting devices are connected, the electron transport layers of all the light-emitting layers are connected, the hole injection layers of all the light-emitting devices are connected, and the cathodes of all the light-emitting devices are connected.

In the exemplary implementation mode, orthographic projections of one or more of the hole injection layer, the hole transport layer, the hole block layer, the electron transport layer, the electron injection layer, and the cathode on the base substrate are continuous. In some examples, at least one of the hole injection layers, hole transport layers, hole block layers, electron transport layers, electron injection layers, and cathodes of the light-emitting devices of at least one row or column are connected. In some examples, at least one of the hole injection layers, hole transport layers, hole block layers, electron transport layers, electron injection layers, and cathodes of multiple light-emitting devices are connected.

In the exemplary implementation mode, since the hole block layer is a connected layer, while the light-emitting layers of different light-emitting devices are isolated, the orthographic projection of the hole block layer on the substrate includes the orthographic projection of the light-emitting layer on the substrate, and the area of the hole block layer is larger than that of the light-emitting layer. Since the hole block layer is a connected layer, the orthographic projection of the hole block layer on the substrate at least includes orthographic projections of light-emitting regions of two light-emitting layers on the substrate. In the exemplary implementation mode, the orthographic projections of the light-emitting layers of at least part of light-emitting devices on the substrate are overlapped with the orthographic projections of the pixel driving circuits on the substrate.

In the exemplary implementation mode, the electron block layer may be used as a micro-cavity adjustment layer of the light-emitting device. The thickness of the electron block layer may be designed to make the thickness of the organic light-emitting layer between the cathode and the anode satisfy the design of the abovementioned micro-cavity length. For example, the other organic layers, except the electron block layers, in two light-emitting layers are the same in thickness, and the thickness of the electron block layer in the red light light-emitting device and the thickness of the electron block layer in the green light light-emitting device are adjusted to make the ratio of the red light micro-cavity length to the green light micro-cavity length consistent with the design. In the exemplary implementation mode, the thickness of the electron block layer in the red light light-emitting device may be about 76 nm to 152 nm. For example, the thickness of the electron block layer in the red light light-emitting device may be about 114 nm. The thickness of the electron block layer in the green light light-emitting device may be about 10 nm to 38 nm. For example, the thickness of the electron block layer in the green light light-emitting device may be about 24 nm. In the exemplary implementation mode, the thickness of the electron block layer may be controlled by adjusting the evaporation rate and the evaporation time. The process is simple, and may be implemented using an existing mature preparation process.

In the exemplary implementation mode, the light-emitting layer may include a host material and a dopant material doped in the host material. The doping ratio of the dopant material of the light-emitting layer is 1% to 20%. In the range of the doping ratio, the host material of the light-emitting layer may effectively transfer exciton energy to the dopant material of the light-emitting layer to excite the dopant material of the light-emitting layer to emit light on one hand. On the other hand, the host material of the light-emitting layer "dilutes" the dopant material of the light-emitting layer, so that fluorescence quenching caused by collisions between molecules of the dopant material of the light-emitting layer and between energy is effectively improved, and the luminous efficiency and the service life of the device are improved. In the exemplary implementation mode, the doping ratio refers to a ratio of the mass of the dopant material to the mass of the light-emitting layer, i.e., a mass percent. In the exemplary implementation mode, the host material and the dopant material may be evaporated together through a multi-source evaporation process so as to be uniformly dispersed in the light-emitting layer. The doping ratio may be controlled during evaporation by controlling the evaporation rate of the dopant material or controlling a ratio of the evaporation rates of the host material and the dopant material. In the exemplary implementation mode, the thickness of the light-emitting layer may be about 10 nm to 50 nm.

In the exemplary implementation mode, the hole injection layer may be made of inorganic oxide, e.g., molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide, or may be made of a mixture of a p-type doping agent of a strong electron-withdrawing system and a hole transport material. In the exemplary implementation mode, the thickness of the hole injection layer may be about 5 nm to 20 nm.

In the exemplary implementation mode, the hole transport layer may be made of a material with relatively high hole mobility, e.g., an arylamine compound, and a substituent group thereof may be carbazole, methylfluorene, spirofluorene, dibenzothiophene, furan, or the like. In the exemplary implementation mode, the thickness of the hole transport layer may be about 40 nm to 150 nm.

In the exemplary implementation mode, the hole transport layer and the electron transport layer may be made of aromatic heterocyclic compounds, e.g., an imidazole derivative like a benzimidazole derivative, an imidazopyridine derivative, and a benzimidazole phenanthridine derivative, an azine derivative like a pyrimidine derivative and a triazine derivative, and a compound including a nitrogen-containing six-membered cyclic structure (also including a compound having a substituent of the phosphine oxide series on a heterocycle) like a quinoline derivative, an isoquinoline derivative, and a phenanthroline derivative. In the exemplary implementation mode, the thickness of the hole block layer may be about 5 nm to 15 nm, and the thickness of the electron transport layer may be about 20 nm to 50 nm.

In the exemplary implementation mode, the electron injection layer may be made of an alkali metal or a metal, e.g., lithium fluoride (LiF), Ytterbium (Yb), Magnesium (Mg), Calcium (Ca), or other materials, or a compound of these alkali metals or metals, etc. In the exemplary implementation mode, the thickness of the electron injection layer may be about 0.5 nm to 2 nm.

In some exemplary implementation modes, the hole transport layer, hole block layer, or electron transport layer in the organic light-emitting layer may be adopted as the micro-cavity adjustment layer of the light-emitting device. No limits are made in the present disclosure.

In some other exemplary implementation modes, the micro-cavity adjustment layer may include any one or more of the hole transport layer, the electron block layer, the hole block layer, and the electron transport layer.

Figure 12:
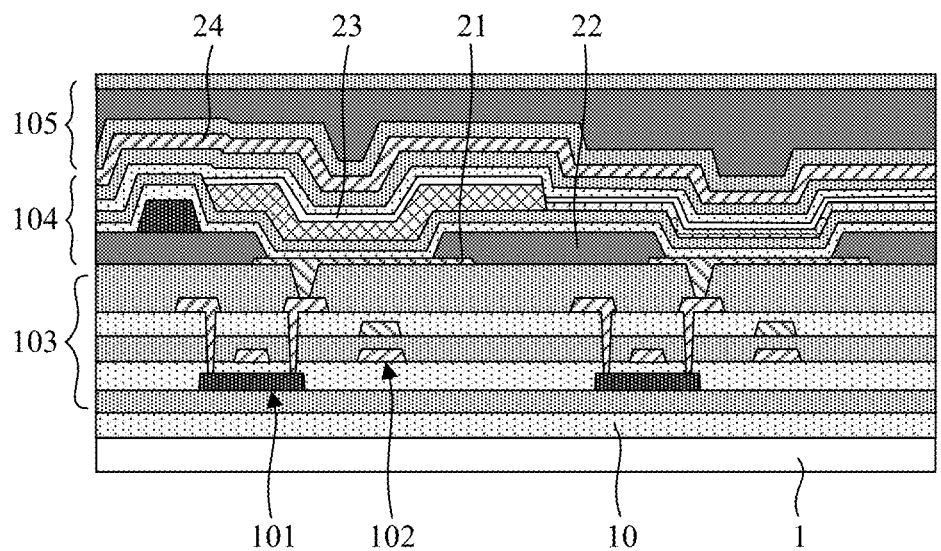
FIG. 12 is a schematic diagram after a pattern of an encapsulation structure layer is formed according to an exemplary embodiment of the present disclosure.

(4) An encapsulation structure layer is formed on the light-emitting structure layer, as shown in FIG. 12. In the exemplary implementation mode, the operation that an encapsulation structure layer is formed on the light-emitting structure layer may include the following operations.

A first inorganic thin film is deposited by Plasma Enhanced Chemical Vapor Deposition (PECVD) through an open mask to form a first encapsulation layer. The plasma enhanced chemical vapor deposition is a low-temperature process, and an operating temperature is about 80 degrees centigrade. Then, ink-jet printing is performed on an organic material on the first encapsulation layer through an ink-jet printing process, and a second encapsulation layer is formed after curing. Next, a second inorganic thin film is deposited through an open mask to form a third encapsulation layer. In the exemplary implementation mode, the first encapsulation layer and the third encapsulation layer may be made of any one or more of silicon oxide (SiOx), silicon nitride (SiNx), and silicon oxynitride (SiON), and may be single-layer, multilayer, or composite. The second encapsulation layer may be made of a resin material.

At this point, the preparation of a pattern of the encapsulation structure layer 105 on the light-emitting structure layer 104 is completed, as shown in FIG. 12. The encapsulation structure layer 105 includes the first encapsulation layer, second encapsulation layer, and third encapsulation layer which are stacked, to form a stacked structure of inorganic material/organic material/inorganic material. The organic material is arranged between two inorganic material layers, so that water vapor may be prevented from entering the light-emitting structure layer from the outside. In the exemplary embodiment, the thickness of the first encapsulation layer may be about 800 nm to 1,200 nm, the thickness of the second encapsulation layer may be about 100,000 nm to 150,000 nm, and the thickness of the third encapsulation layer may be about 800 nm to 1,200 nm.

In the exemplary implementation mode, a touch structure layer (Touch Screen Panel, TSP) may be formed on the encapsulation structure layer after the preparation of the encapsulation structure layer is completed. The touch structure layer may include a touch electrode layer, or a touch electrode layer and a touch insulating layer.

In the exemplary implementation mode, the preparation process of the display substrate may further include stripping of the glass carrier plate 1, adhesion of a back film, cutting, and other processes when the flexible display substrate is prepared. No limits are made in the present disclosure.

The structure shown in the exemplary embodiment of the present disclosure and the preparation process thereof are only exemplary description. In the exemplary implementation mode, variation of corresponding structures and addition or reduction of patterning processes may be performed as practically required. For example, the transistor in the driving structure layer may be a top-gate structure or bottom-gate structure, and may be a single-gate structure or a double-gate structure. For another example, other film layer structures, electrode structures, or lead structures may further be arranged in the driving structure layer and the light-emitting structure layer. For another example, the base substrate may be a glass base substrate. No specific limits are made in the present disclosure.

It can be seen from the structure and preparation process of the display substrate of the exemplary embodiment of the present disclosure that, in the exemplary embodiment of the present disclosure, the color deviation is used, and the micro-cavity optical structures in the two light light-emitting devices and the relationship between the micro-cavity lengths in the two light light-emitting devices may be set to make the display substrate present different colors when the viewer views the display substrate at different view angles. The micro-cavity length of the red light light-emitting device is set to be about twice the red reference cavity length, and the micro-cavity length of the green light light-emitting device is set to be about ¼ of the green reference cavity length, so that brightness decaying trends of the red light and the green light under a large view angle are controlled to ensure that the brightness of the red light emitted by the red light light-emitting device gradually increases with the enlargement of the view angle and the brightness of the green light emitted by the green light light-emitting device gradually decreases with the enlargement of the view angle. Therefore, colors and color coordinates of the display substrate under different view angles may be controlled to further implement the displaying of red light, green light, and yellow light by the same display substrate under different angles respectively. That is, the display substrate presents green in the vicinity of view angle $\theta=0°$, presents yellow in the vicinity of $\theta=35°$, and presents red in the vicinity of $\theta=60°$.

Figure 13:
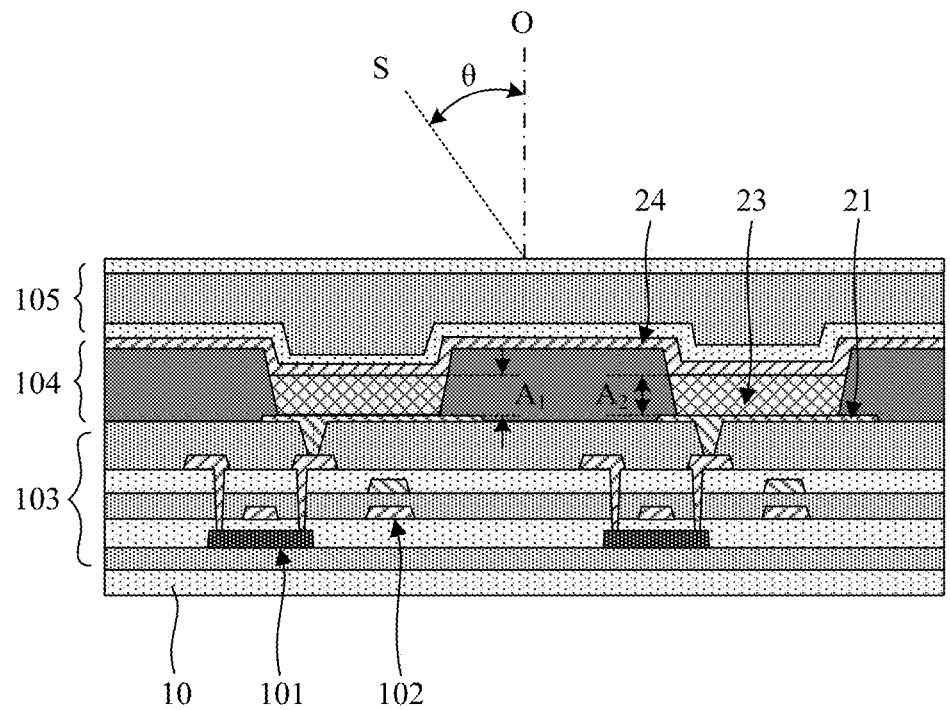
FIG. 13 is a schematic diagram of a sectional view of structure of another display substrate according to an exemplary embodiment of the present disclosure.

FIG. 13 is a schematic diagram of a sectional view of structure of another display substrate according to an exemplary embodiment of the present disclosure. The display substrate may include multiple light-emitting units arranged in a matrix on a plane parallel to the display substrate. At least one light-emitting unit in the multiple light-emitting units includes a first light-emitting device that emits first-color light and a second light-emitting device that emits second-color light. FIG. 13 illustrates structures of the first light-emitting device and the second light-emitting device. As shown in FIG. 13, on a plane perpendicular to the display substrate, the display substrate may include a driving structure layer 103 arranged on a base substrate 10, a light-emitting structure layer 104 arranged on a side of the driving structure layer 103 away from the base substrate 10, and an encapsulation structure layer 105 arranged on a side of the light-emitting structure layer 104 away from the base substrate 10. The light-emitting structure layer 104 of at least one light-emitting device may include an anode 21, an organic light-emitting layer 23, and a cathode 24. The organic light-emitting layer 23 is arranged between the anode 21 and the cathode 24. A distance between the anode for reflecting light and the cathode for reflecting and transmitting light is a micro-cavity length. The micro-cavity length may be a thickness of the organic light-emitting layer between the anode and the cathode.

In an exemplary implementation mode, a ratio of a first micro-cavity length $A_1$ of the first light-emitting device (i.e., a thickness of the organic light-emitting layer in the first light-emitting device) and a second micro-cavity length $A_2$ of the second light-emitting device (i.e., a thickness of the organic light-emitting layer in the second light-emitting device) may be about 0.75K to 1.06K. The ratio of the micro-cavity lengths of the first light-emitting device and the second light-emitting device may be set to make the display substrate display different colors when a viewer views the light-emitting unit at different view angles $\theta$. For example, when the viewer views the light-emitting unit in a first view angle range smaller than a first view angle, the display substrate including the first light-emitting device that emits the first-color light and the second light-emitting device that emits the second-color light displays a first color. When the viewer views the light-emitting unit in a second view angle range larger than a second view angle, the display substrate including the first light-emitting device that emits the first-color light and the second light-emitting device that emits the second-color light displays a second color. When the viewer views the light-emitting unit in a third view angle range larger than the first view angle and smaller than the second view angle, the display substrate including the first light-emitting device that emits the first-color light and the second light-emitting device that emits the second-color light displays a third color, namely the display substrate displays a synthetic color of the first color and the second color.

In an exemplary implementation mode, the first view angle, the second view angle, the first view angle range, the second view angle range, and the third view angle range may be the same as those in the abovementioned embodiment.

In some exemplary implementation modes, the ratio of the first micro-cavity length $A_1$ of the first light-emitting device and the second micro-cavity length $A_2$ of the second light-emitting device may be about 0.83K to 0.95K.

In some other exemplary implementation modes, the ratio of the first micro-cavity length $A_1$ of the first light-emitting device and the second micro-cavity length $A_2$ of the second light-emitting device may be about 0.89K.

In an exemplary implementation mode, the first-color light includes red light, the first light-emitting device includes a red light light-emitting device that emits red light, the second-color light includes green light, and the second light-emitting device includes a green light light-emitting device that emits green light. That is, the light-emitting unit in the exemplary embodiment of the present disclosure consists of a red light light-emitting device and a green light light-emitting device.

In the exemplary embodiment of the present disclosure, the red light micro-cavity length of the red light light-emitting device may be set to be about 0.9 to 1.1 times the red light reference cavity length $L_R$, and the green light micro-cavity length of the green light light-emitting device may be set to be about 1.04 to 1.20 times the green light reference cavity length $L_G$. That is, the red light micro-cavity length of the red light light-emitting device is about $0.75\lambda_R/\lambda_G$ to $1.06\lambda_R/\lambda_G$ times the green light micro-cavity length. When $\lambda_R/\lambda_G=1.2$, the red light micro-cavity length of the red light light-emitting device is about 0.9 to 1.27 times the green light micro-cavity length of the green light light-emitting device. By such a setting, the display substrate including the red light light-emitting device and the green light light-emitting device displays red when the viewer views the light-emitting unit at a view angle ranging from 0° to 15°, the display substrate including the red light light-emitting device and the green light light-emitting device displays yellow when the viewer views the light-emitting unit at a view angle ranging from 25° to 40°, and the display substrate including the red light light-emitting device and the green light light-emitting device displays green when the viewer views the light-emitting unit at a view angle ranging from 55° to 65°. Therefore, the display substrate displays different colors when the viewer views the light-emitting unit at different view angles θ.

In some possible implementation modes, the red light micro-cavity length of the red light light-emitting device may be set to be about 0.95 to 1.05 times the red light reference cavity length $L_R$, and the green light micro-cavity length of the green light light-emitting device may be set to be about 1.10 to 1.14 times the green light reference cavity length $L_G$. That is, the red light micro-cavity length of the red light light-emitting device is about $0.83\lambda_R/\lambda_G$ to $0.95\lambda_R/\lambda_G$ times the green light micro-cavity length of the green light light-emitting device. When $\lambda_R/\lambda_G=1.2$, the red light micro-cavity length of the red light light-emitting device is about 1.0 to 1.14 times the green light micro-cavity length of the green light light-emitting device.

In some other possible implementation modes, the red light micro-cavity length of the red light light-emitting device may be set to be about once the red light reference cavity length $L_R$, and the green light micro-cavity length of the green light light-emitting device may be set to be about 1.12 times the green light reference cavity length $L_G$. That is, the red light micro-cavity length of the red light light-emitting device is about $0.89\lambda_R/\lambda_G$ times the green light micro-cavity length of the green light light-emitting device. When $\lambda_R/\lambda_G=1.2$, the red light micro-cavity length of the red light light-emitting device is about 1.07 times the green light micro-cavity length of the green light light-emitting device.

In an exemplary implementation mode, the red light micro-cavity length of the red light light-emitting device may be determined according to wavelength 630 nm. The red light micro-cavity length may be about 260 nm to 320 nm. For example, the red light micro-cavity length may be about 290 nm. The green light micro-cavity length of the green light light-emitting device may be determined according to wavelength 530 nm. The green light micro-cavity length may be about 250 nm to 290 nm. For example, the green light micro-cavity length may be about 270 nm.

Figure 14:
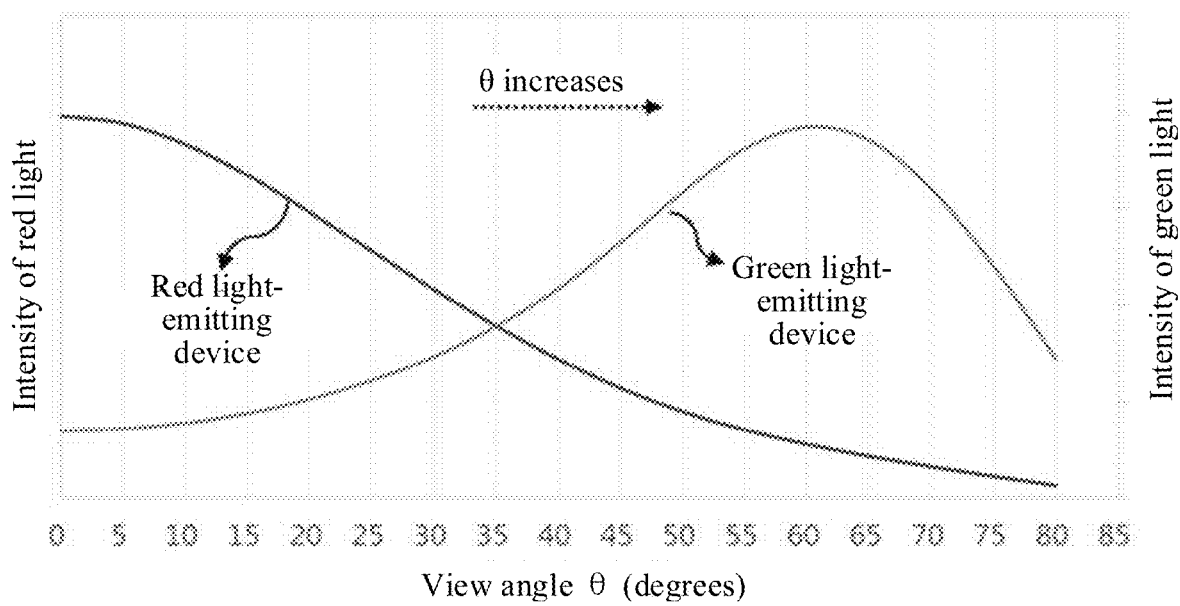
FIG. 14 is a schematic diagram of a brightness changing trend of a red light light-emitting device and green light light-emitting device in another display substrate under different view angles according to an exemplary embodiment of the present disclosure.

FIG. 14 is a schematic diagram of a brightness changing trend of a red light light-emitting device and green light light-emitting device in another display substrate under different view angles according to an exemplary embodiment of the present disclosure. The red light micro-cavity length of the red light light-emitting device is set to be about once the red light reference cavity length $L_R$. The micro-cavity gain spectrum of the red light light-emitting device is on the left of an eigen spectrum thereof, and is overlapped with the eigen spectrum thereof to a relatively great extent. The green light micro-cavity length of the green light light-emitting device is set to be about 1.12 times the green light reference cavity length $L_G$. The micro-cavity gain spectrum of the green light light-emitting device is on the right of an eigen spectrum thereof. As shown in FIG. 14, the brightness of the red light emitted by the red light light-emitting device is maximum when the view angle θ is about 0°, and gradually decreases with the enlargement of the view angle θ. The brightness of the green light emitted by the green light light-emitting device gradually increases with the enlargement of the view angle θ, and starts decaying after reaching a maximum value. Therefore, in the vicinity of view angle θ=0°, the synthetic light is red, the display picture of the display substrate is a red picture, and corresponding color coordinates are about (0.632, 0.358). In the vicinity of view angle θ=35°, the synthetic light is yellow, the display picture of the display substrate is a yellow picture, and corresponding color coordinates are about (0.441, 0.521). In the vicinity of θ=60°, the synthetic light is green, the display picture of the display substrate is a green picture, and corresponding color coordinates are about (0.285, 0.656).

In the exemplary embodiment of the present disclosure, the color deviation is used, and the micro-cavity optical structures in the two light light-emitting devices and the relationship between the micro-cavity lengths in the two light light-emitting devices may be set to make the display substrate present different colors when the viewer views the display substrate at different view angles. The micro-cavity length of the red light light-emitting device is set to be about once the red reference cavity length, and the micro-cavity length of the green light light-emitting device is set to be about twice the green reference cavity length, so that brightness decaying trends of the red light and the green light under a large view angle are controlled to ensure that the brightness of the red light emitted by the red light light-emitting device gradually decreases with the enlargement of the view angle and the brightness of the green light emitted by the green light light-emitting device gradually increases with the enlargement of the view angle. Therefore, colors and color coordinates of the display substrate under different view angles may be controlled to further implement the displaying of red light, green light, and yellow light by the same display substrate under different angles respectively. That is, the display substrate presents red in the vicinity of view angle θ=0°, presents yellow in the vicinity of θ=35°, and presents green in the vicinity of θ=60°.

The present disclosure also provides a preparation method for a display substrate. The display substrate includes multiple light-emitting units. At least one light-emitting unit includes a first light-emitting device that emits first-color light and a second light-emitting device that emits second-color light. In an exemplary implementation mode, the preparation method includes the following operation.

A driving structure layer, a light-emitting structure layer arranged on the driving structure layer, and an encapsulation structure layer arranged on the light-emitting structure layer are sequentially formed on a base substrate. The light-emitting structure layer includes an anode, a cathode, and an organic light-emitting layer arranged between the anode and the cathode. In a micro-cavity formed by the anode and the cathode, a distance between an anode and cathode in the first light-emitting device is a first micro-cavity length, and a distance between an anode and cathode in the second light-emitting device is a second micro-cavity length. A ratio of the first micro-cavity length to the second micro-cavity length is 1.24K to 1.63K. Or, a ratio of the first micro-cavity length to the second micro-cavity length is 0.75K to 1.06K. $K=\lambda_1/\lambda_2$, where $\lambda_1$ is a wavelength of the first-color light emitted by the first light-emitting device, and $\lambda_2$ is a wavelength of the second-color light emitted by the second light-emitting device.

The exemplary embodiment of the present disclosure provides the preparation method for a display substrate. A color deviation is used, and micro-cavity optical structures in the two light light-emitting devices and a relationship between the micro-cavity lengths in the two light light-emitting devices may be set to make the display substrate present different colors when a viewer views the display substrate at different view angles. The preparation method for a display substrate in the exemplary embodiment of the present disclosure is high in process compatibility, production efficiency, and yield, simple in process implementation, easy to implement, and low in production cost.

The present disclosure also provides a display device, which includes the abovementioned display substrate. In an exemplary implementation mode, the display device may be a red yellow green signal display device.

Figure 15A:
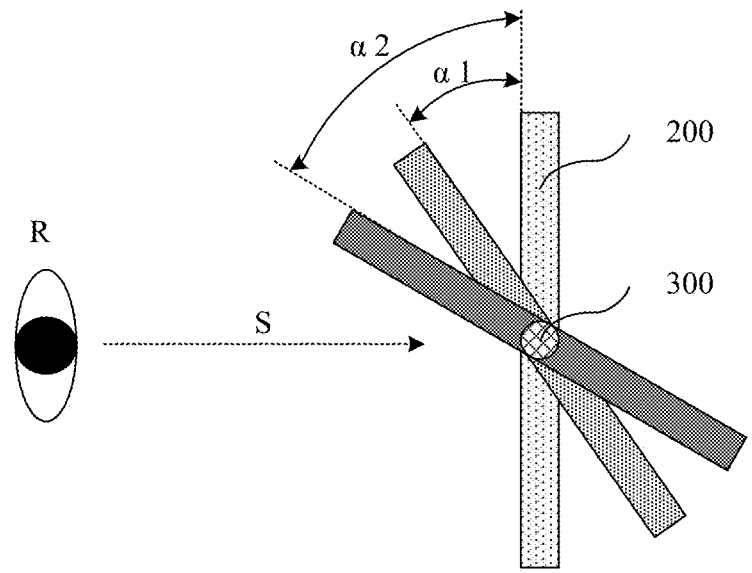
FIGS. 15a and 15b are schematic structural diagrams of a display device according to an exemplary embodiment of the present disclosure.
Figure 15B:
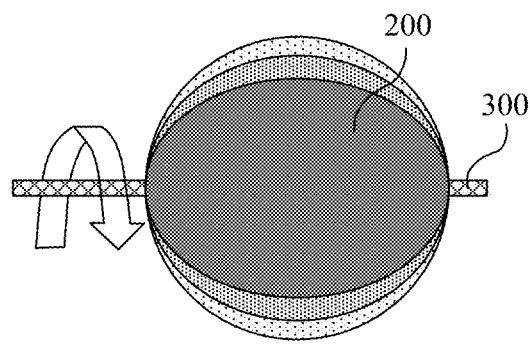

FIGS. 15a and 15b are schematic structural diagrams of a display device according to an exemplary embodiment of the present disclosure. FIG. 15a is a schematic side view. FIG. 15b is a schematic front view. As shown in FIGS. 15a and 15b, the display device may be a red yellow green signal display device. The red yellow green signal display device may include a display device 200 and a first driving device 300. The display device 200 may include the abovementioned display substrate. The display substrate may be a rigid display substrate. The first driving device 300 is arranged to rotate the display device 200. The rotated display device 200 presents pictures of different colors to a viewer R. In an exemplary implementation mode, the first driving device 300 may be a rotating mechanism. The first driving device 300 is connected with the display device 200 and arranged to rotate the display device 200. For example, the rotating mechanism may at least include a rotating shaft arranged in the middle of the display device 200, and the display device 200 rotates taking the rotating shaft as an axis.

Figure 15C:
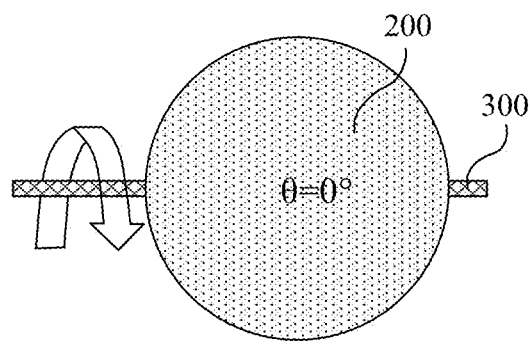
FIGS. 15c to 15e are schematic diagrams of rotation of a display device according to an exemplary embodiment of the present disclosure.
Figure 15D:
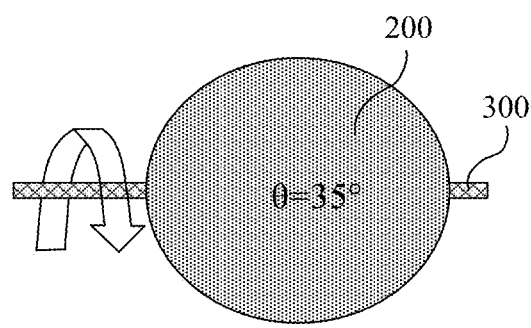
Figure 15E:
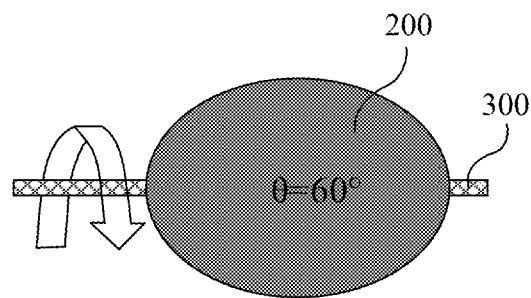

FIGS. 15c to 15e are schematic diagrams of rotation of a display device according to an exemplary embodiment of the present disclosure. When the display device 200 does not deflect, a display surface in the display device 200 faces the viewer R, a normal of the display surface is parallel to a line of sight S of the viewer R (i.e., a view angle θ is 0°), and a picture presented to the viewer R by the display surface is a green picture, as shown in FIGS. 15a and 15c. When the display device 200 deflects $\alpha_1=35°$, an included angle between the normal of the display surface in the display device and the line of sight S of the viewer R is 35° (i.e., the view angle θ is 35°), and the picture presented to the viewer R by the display surface is a yellow picture, as shown in FIGS. 15a and 15d. When the display device 200 deflects $\alpha_2=60°$, the included angle between the normal of the display surface in the display device and the line of sight S of the viewer R is 60° (i.e., the view angle θ is 60°), and the picture presented to the viewer R by the display surface is a red picture, as shown in FIGS. 15a and 15e.

According to the exemplary embodiment of the present disclosure, by using the characteristic that the color displayed by the display device changes with the view angle, the formed red yellow green signal display device may implement the displaying of red, yellow and green signals using the same display screen only by controlling a rotation angle of the display device.

The red yellow green signal display device of the exemplary embodiment of the present disclosure is only exemplary description. In an exemplary implementation mode, corresponding structures and display manners may be varied as practically required. For example, the display surface presents a red picture when the display device does not deflect, and presents a green picture when the display device defects 60°. For another example, a planar shape of the display device may be another shape. For another example, the rotating shaft may be arranged at another position of the display device or rotate the display device in another manner. No specific limits are made in the present disclosure.

Figure 16A:
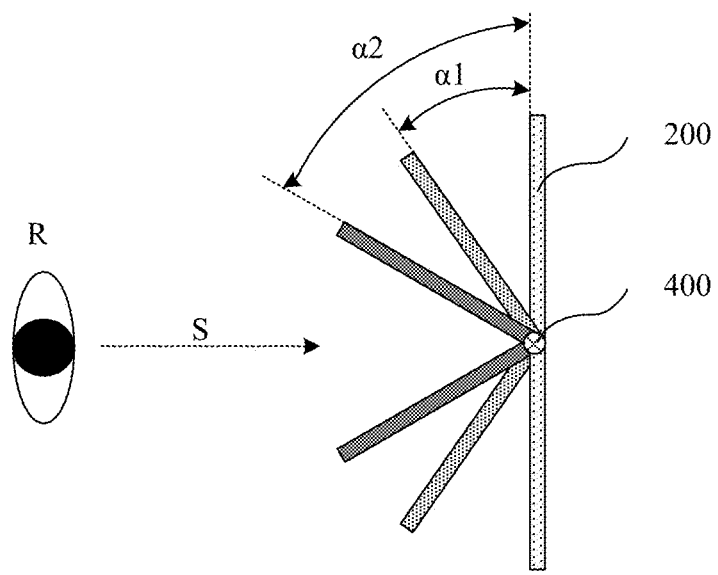
FIGS. 16a and 16b are schematic structural diagrams of another display device according to an exemplary embodiment of the present disclosure.
Figure 16B:
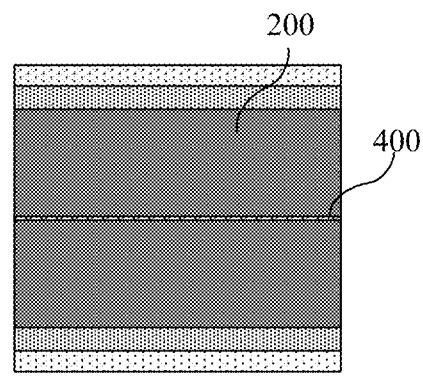

FIGS. 16a and 16b are schematic structural diagrams of another display device according to an exemplary embodiment of the present disclosure. FIG. 16a is a schematic side view. FIG. 16b is a schematic front view. As shown in FIGS. 16a and 16b, the display device may be a red yellow green signal display device. The red yellow green signal display device may include a display device 200 and a second driving device 400. The display device 200 may include the abovementioned display substrate. The display substrate may be a flexible display substrate. The second driving device 400 is arranged to fold the display device 200. The folded display device 200 presents pictures of different colors to a viewer R. In an exemplary implementation mode, the second driving device 400 may be a folding mechanism. The second driving device 400 is connected with the display device 200 and arranged to fold the display device 200. For example, the folding mechanism may at least include a folding shaft arranged in the middle of the display device 200, and the display device 200 is folded taking the folding shaft as an axis.

Figure 16C:
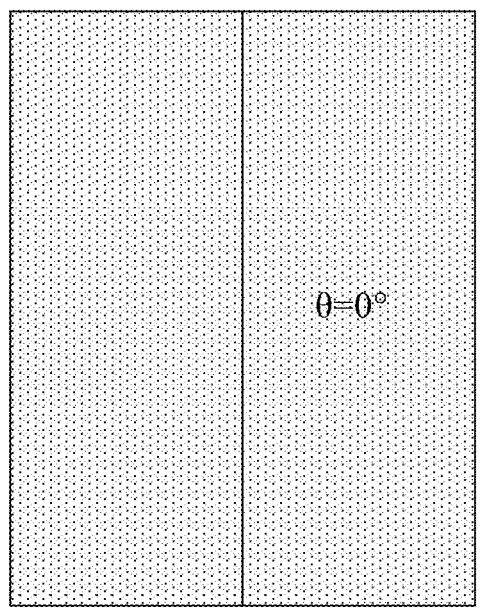
FIGS. 16c to 16e are schematic diagrams of folding of another display device according to an exemplary embodiment of the present disclosure.
Figure 16D:
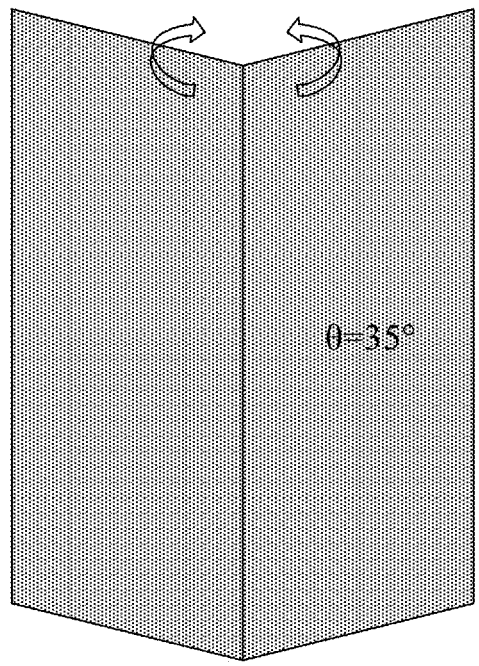
Figure 16E:
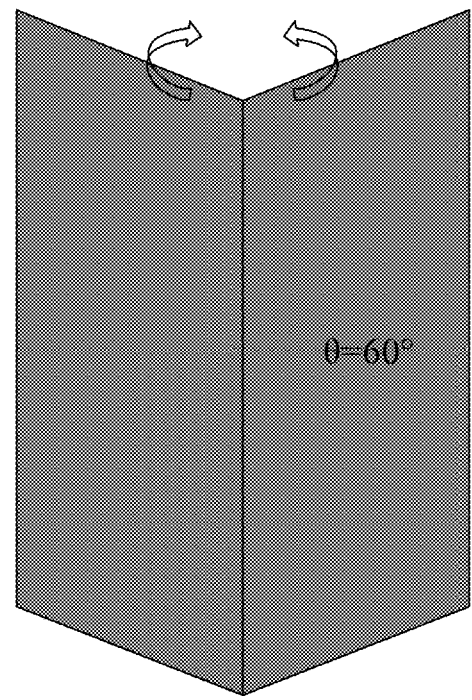

FIGS. 16c to 16e are schematic diagrams of folding of another display device according to an exemplary embodiment of the present disclosure. When the display device 200 is not folded, a display surface in the display device 200 faces the viewer R, a normal of the display surface is parallel to a line of sight S of the viewer R (i.e., a view angle θ is 0°), and a picture presented to the viewer R by the display surface is a green picture, as shown in FIGS. 16a and 16c. When the display device 200 is folded by $\alpha_1=35°$, an included angle between the normal of the display surface in the display device and the line of sight S of the viewer R is 35° (i.e., the view angle θ is 35°), and the picture presented to the viewer R by the display surface is a yellow picture, as shown in FIGS. 16a and 16d. When the display device 200 is folded by $\alpha_2=60°$, the included angle between the normal of the display surface in the display device and the line of sight S of the viewer R is 60° (i.e., the view angle θ is 60°), and the picture presented to the viewer R by the display surface is a red picture, as shown in FIGS. 16a and 16e.

According to the exemplary embodiment of the present disclosure, by using the characteristic that the color displayed by the display device changes with the view angle, the formed red yellow green signal display device may implement the displaying of red, yellow and green signals using the same display screen only by controlling a folding angle of the display device.

The red yellow green signal display device of the exemplary embodiment of the present disclosure is only exemplary description. In an exemplary implementation mode, corresponding structures and display manners may be varied as practically required. For example, the display surface presents a red picture when the display device is not folded, and presents a green picture when the display device is folded by 60°. For another example, a planar shape of the display device may be another shape. For another example, the folding shaft may be arranged at another position of the display device or fold the display device in another manner. No specific limits are made in the present disclosure.

Although the implementation modes of the present disclosure are disclosed above, the contents are only implementation modes adopted to easily understand the present disclosure and not intended to limit the present disclosure. Those skilled in the art may make any modifications and variations to implementation forms and details without departing from the spirit and scope disclosed by the present disclosure. However, the patent protection scope of the present application should also be subject to the scope defined by the appended claims.

What we claim is:

1. A display substrate, comprising: multiple light-emitting units,
   wherein at least one light-emitting unit comprises a first light-emitting device configured to emit light of a first color and a second light-emitting device configured to emit light of a second color;
   wherein the display substrate is configured to display the first color in a first view angle range smaller than a first view angle, and display the second color in a second view angle range larger than a second view angle; or, the display substrate is configured to display the second color in the first view angle range smaller than the first view angle, and display the first color in the second view angle range larger than the second view angle;
   wherein the first view angle and the second view angle are each an included angle between a line of sight of a viewer and a normal of a viewing region in the display substrate, and the second view angle is larger than the first view angle;
   wherein the first color is different from the second color; and the first view angle range is different from the second view angle range;
   wherein the display substrate comprises a driving structure layer arranged on a base substrate, a light-emitting structure layer arranged on the driving structure layer, and an encapsulation structure layer arranged on the light-emitting structure layer; and
   wherein the light-emitting structure layer comprises an anode, a cathode, and an organic light-emitting layer arranged between the anode and the cathode; in a micro-cavity formed by the anode and the cathode, a first distance between an anode and a cathode in the first light-emitting device, emitting light of the first color, falls within a first micro-cavity length range, and a second distance between an anode and a cathode in the second light-emitting device, emitting light of the second color which is different from the first color, falls within a second micro-cavity length range; a ratio range of the first distance to the second distance falls within a range of 1.24K to 1.63K, or, a ratio of the first distance to the second distance falls within a range of 0.75K to 1.06K; wherein K=$\lambda_1/\lambda_2$, $\lambda_1$ is a wavelength of the light of the first color emitted by the first light-emitting device, and $\lambda_2$ is a wavelength of the light of the second color emitted by the second light-emitting device.

2. The display substrate according to claim 1, wherein the display substrate is configured to display a third color in a third view angle range whose lower limit is larger than the first view angle and whose upper limit is smaller than the second view angle.

3. The display substrate according to claim 2, wherein the first view angle range is 0° to 15°, the second view angle range is 55° to 65°, and the third view angle range is 25° to 40°.

4. The display substrate according to claim 2, wherein the first color comprises red, the second color comprises green, and the third color comprises yellow; and the first micro-cavity length range is 340 nm to 370 nm, and the second micro-cavity length range is 190 nm to 230 nm.

5. The display substrate according to claim 2, wherein the first color comprises red, the second color comprises green, and the third color comprises yellow; and the first micro-cavity length range is 260 nm to 320 nm, and the second micro-cavity length range is 250 nm to 290 nm.

6. The display substrate according to claim 2, wherein the organic light-emitting layer comprises an electron block layer, a light-emitting layer, and a hole block layer which are stacked, the electron block layer is arranged between the anode and the light-emitting layer, and the hole block layer is arranged between the cathode and the light-emitting layer; a light-emitting layer in the first light-emitting device comprises a first color light-emitting layer, and a light-emitting layer in the second light-emitting device comprises a second color light-emitting layer; a thickness of a hole block layer in the first light-emitting device is the same as that of a hole block layer in the second light-emitting device; a thickness of an electron block layer in the first light-emitting device is within 76 nm to 152 nm, and a thickness of an electron block layer in the second light-emitting layer is within 10 nm to 38 nm.

7. The display substrate according to claim 6, wherein the organic light-emitting layer further comprises a hole transport layer and an electron transport layer, the hole transport layer is arranged between the anode and the electron block layer, and the electron transport layer is arranged between the cathode and the hole block layer; a thickness of a hole transport layer in the first light-emitting device is the same as that of a hole transport layer in the second light-emitting device; and a thickness of an electron transport layer in the first light-emitting device is the same as that of an electron transport layer in the second light-emitting device.

8. The display substrate according to claim 1, wherein the first view angle falls within a range of 15° to 20°, and the second view angle falls within 50° to 55°.

9. The display substrate according to claim 1, wherein the organic light-emitting layer comprises an electron block layer, a light-emitting layer, and a hole block layer which are stacked, the electron block layer is arranged between the anode and the light-emitting layer, and the hole block layer is arranged between the cathode and the light-emitting layer;

a light-emitting layer in the first light-emitting device comprises a first color light-emitting layer, and a light-emitting layer in the second light-emitting device comprises a second color light-emitting layer; a thickness of a hole block layer in the first light-emitting device is the same as that of a hole block layer in the second light-emitting device; a thickness of an electron block layer in the first light-emitting device is within 76 nm to 152 nm, and a thickness of an electron block layer in the second light-emitting layer is within 10 nm to 38 nm.

10. The display substrate according to claim 9, wherein the organic light-emitting layer further comprises a hole transport layer and an electron transport layer, the hole transport layer is arranged between the anode and the electron block layer, and the electron transport layer is arranged between the cathode and the hole block layer; a thickness of a hole transport layer in the first light-emitting device is the same as that of a hole transport layer in the second light-emitting device; and a thickness of an electron transport layer in the first light-emitting device is the same as that of an electron transport layer in the second light-emitting device.

11. The display substrate according to claim 10, wherein the organic light-emitting layer further comprises a hole injection layer and an electron injection layer, the hole injection layer is arranged between the anode and the hole transport layer, and the electron injection layer is arranged between the cathode and the electron transport layer; a thickness of a hole injection layer in the first light-emitting device is the same as that of a hole injection layer in the second light-emitting device; and a thickness of an electron injection layer in the first light-emitting device is the same as that of an electron injection layer in the second light-emitting device.

12. A display device, comprising the display substrate according to claim 1.

13. The display device according to claim 12, further comprising a driving device connected with the display substrate and configured to deflect the display substrate.

14. The display device according to claim 13, wherein the driving device comprises a rotating mechanism capable of rotating the display substrate.

15. The display device according to claim 13, wherein the driving device comprises a folding mechanism capable of folding the display substrate.

16. A preparation method for a display substrate, the display substrate comprising multiple light-emitting units, at least one light-emitting unit comprising a first light-emitting device configured to emit light of a first color and a second light-emitting device configured to emit light of a second color, wherein the first color is different from the second color, the preparation method comprising:

sequentially forming, on a base substrate, a driving structure layer, a light-emitting structure layer arranged on the driving structure layer, and an encapsulation structure layer arranged on the light-emitting structure layer, wherein the light-emitting structure layer comprises an anode, a cathode, and an organic light-emitting layer arranged between the anode and the cathode; in a micro-cavity formed by the anode and the cathode, a first distance between an anode and a cathode in the first light-emitting device, emitting light of the first color, falls within a first micro-cavity length range, and a second distance between an anode and a cathode in the second light-emitting device, emitting light of the second color which is different from the first color, falls within a second micro-cavity length range; a ratio of the first distance to the second distance falls within 1.24K to 1.63K, or, a ratio of the first distance to the second distance falls within 0.75K to 1.06K; wherein $K=\lambda_1/\lambda_2$, $\lambda_1$ is a wavelength of the light of the first color light emitted by the first light-emitting device, and $\lambda_2$ is a wavelength of the light of the second color emitted by the second light-emitting device.

* * * * *